US010862453B2

(12) United States Patent
Miyazaki et al.

(10) Patent No.: US 10,862,453 B2
(45) Date of Patent: Dec. 8, 2020

(54) CRYSTAL OSCILLATING ELEMENT, CRYSTAL OSCILLATION DEVICE, AND METHOD OF MANUFACTURING CRYSTAL OSCILLATING ELEMENT

(71) Applicant: KYOCERA Corporation, Kyoto (JP)

(72) Inventors: Shiro Miyazaki, Higashine (JP); Masahiko Goto, Tendo (JP); Yoshiyuki Kawaguchi, Soraku-gun (JP); Hiroshi Hayashi, Moriyama (JP)

(73) Assignee: KYOCERA CORPORATION, Kyoto (JP)

( * ) Notice: Subject to any disclaimer, the term of this patent is extended or adjusted under 35 U.S.C. 154(b) by 7 days.

(21) Appl. No.: 16/320,942

(22) PCT Filed: Jul. 25, 2017

(86) PCT No.: PCT/JP2017/026840
§ 371 (c)(1),
(2) Date: Jan. 25, 2019

(87) PCT Pub. No.: WO2018/021296
PCT Pub. Date: Feb. 1, 2018

(65) Prior Publication Data
US 2019/0207584 A1    Jul. 4, 2019

(30) Foreign Application Priority Data
Jul. 28, 2016   (JP) .................................. 2016-148234

(51) Int. Cl.
*H03H 9/19*  (2006.01)
*H03H 3/02*  (2006.01)
(Continued)

(52) U.S. Cl.
CPC ............... *H03H 9/19* (2013.01); *H01L 41/09* (2013.01); *H01L 41/332* (2013.01); *H03H 3/02* (2013.01);
(Continued)

(58) Field of Classification Search
CPC ... H03H 9/19; H03H 9/13; H03H 3/02; H01L 41/09; H01L 41/332
See application file for complete search history.

(56) References Cited

U.S. PATENT DOCUMENTS 7,368,857 B2 * 5/2008 Tanaka ............... H03H 9/02086
310/322
8,963,402 B2 * 2/2015 Kusano ............. H03H 9/02023
310/348
(Continued)

FOREIGN PATENT DOCUMENTS

| JP | 04-294622 A | 10/1992 |
| JP | 2005-136499 A | 5/2005 |

(Continued)

*Primary Examiner* — J. San Martin
(74) *Attorney, Agent, or Firm* — Volpe Koenig

(57) ABSTRACT

The oscillating element includes a crystal blank, a pair of excitation electrodes, and a pair of pad portions. The crystal blank includes a pair of major surfaces, at least partially configured by crystal planes, and side surfaces which connect outer edges of the pair of major surfaces. Further, it includes a mesa portion and an outer peripheral portion which surrounds the mesa portion and has a thickness between the pair of major surfaces thinner than that of the mesa portion. The excitation electrodes are individually located on the pair of major surfaces. The pair of pad portions are located on one of the pairs of major surfaces and are electrically connected with the excitation electrodes. At least a portion of an edge part which is in contact with a (Continued)

crystal plane includes a projecting portion, which does not exceed the height of the mesa portion from the outer peripheral portion.

7 Claims, 10 Drawing Sheets

(51) Int. Cl.
  *H03H 9/17*   (2006.01)
  *H03H 9/10*   (2006.01)
  *H01L 41/09*  (2006.01)
  *H01L 41/332* (2013.01)
  *H03H 9/13*   (2006.01)

(52) U.S. Cl.
  CPC ............ *H03H 9/1021* (2013.01); *H03H 9/13* (2013.01); *H03H 9/177* (2013.01); *H03H 2003/022* (2013.01)

(56) References Cited

U.S. PATENT DOCUMENTS

| | | |
|---|---|---|
| 2005/0116586 A1 | 6/2005 | Tanaya et al. |
| 2005/0200240 A1* | 9/2005 | Tanaka ............... H03H 9/02086 310/333 |
| 2011/0095657 A1* | 4/2011 | Yamashita ........... H03H 9/1021 310/367 |
| 2012/0229223 A1* | 9/2012 | Ii ............................. H03H 3/02 331/155 |
| 2016/0226444 A1* | 8/2016 | Yamashita ........... H03H 9/1021 |
| 2016/0226445 A1* | 8/2016 | Yamashita ............. H03H 9/177 |
| 2016/0226465 A1* | 8/2016 | Yamashita ........... H03H 9/1007 |
| 2018/0069521 A1* | 3/2018 | Sai .......................... H03H 9/19 |

FOREIGN PATENT DOCUMENTS

| | | |
|---|---|---|
| JP | 2006-166390 A | 6/2006 |
| JP | 2013-138479 A | 7/2013 |
| JP | 2014-027505 A | 2/2014 |
| JP | 2014-027506 A | 2/2014 |
| JP | 2015-186237 A | 10/2015 |

* cited by examiner

CRYSTAL OSCILLATING ELEMENT, CRYSTAL OSCILLATION DEVICE, AND METHOD OF MANUFACTURING CRYSTAL OSCILLATING ELEMENT

TECHNICAL FIELD

The present disclosure relates to a crystal oscillating element, a crystal oscillation device having the crystal oscillating element, and a method for manufacturing a crystal oscillating element. The crystal oscillation device is for example a crystal unit or crystal oscillator.

BACKGROUND ART

A crystal oscillating element used in a crystal unit, crystal oscillator, or the like has for example a plate-shaped crystal blank and a pair of excitation electrodes superimposed on a pair of major surfaces (broadest surfaces; front and back of plate-shaped member) of the crystal blank. The crystal blank is for example formed by etching a crystal wafer cut out of quartz crystal. Further, the pair of major surfaces of the crystal blank are formed by the pair of major surfaces of the crystal wafer, while the side surfaces of the crystal blank (surfaces connecting the pair of major surfaces to each other) are formed by crystal planes appearing due to the etching.

As the crystal oscillating element, a so-called "mesa type" one is known. The crystal blank in this crystal oscillating element has a mesa portion and an outer peripheral portion which is positioned on the periphery of the mesa portion when viewing the major surfaces of the crystal blank on a plane and is thinner than the mesa portion. The pair of excitation electrodes are provided on the pair of major surfaces of the mesa portion.

Patent Literatures 1 and 2 disclose as the method for forming the mesa type crystal blank a method of successively performing etching for forming an outer shape (side surfaces) of a crystal blank (outer peripheral portion) and etching for cutting down (making thinner) the outer peripheral portion of the crystal blank to make the crystal blank a mesa shape. Further, Patent Literatures 1 and 2 disclose that the number (types) of crystal planes appearing at the side surfaces of the crystal blank (outer peripheral portion) increases by increasing the amount of the outer peripheral portion cut down (make the etching time longer). Patent Literatures 1 and 2 claim that by increasing the number of crystal planes, reduction of the CI (crystal impedance) and other effects are obtained.

CITATION LIST

Patent Literature

Patent Literature 1: Japanese Patent Publication No. 2014-27505A
Patent Literature 2: Japanese Patent Publication No. 2014-27506A

SUMMARY OF INVENTION

A crystal oscillating element according to one aspect of the present disclosure includes a crystal blank, a pair of excitation electrodes, and a pair of pads. The crystal blank includes a pair of major surfaces and side surfaces which connect outer edges of the pair of major surfaces to each other and includes at least a portion which is comprised of a crystal plane. Further, the crystal blank includes a mesa portion and an outer peripheral portion which surrounds the mesa portion when viewing the pair of major surfaces on a plane and which has a thickness between the pair of major surfaces thinner than the mesa portion. The pair of excitation electrodes are respectively located on the pair of major surfaces at the mesa portion. The pair of pads are located on one of the pair of major surfaces at the outer peripheral portion and are electrically connected with the pair of excitation electrodes. The crystal blank includes at least one projecting portion which projects from the outer peripheral portion by a height not more than a height of the mesa portion from the outer peripheral portion in at least a portion of an edge part in the pair of major surfaces, the edge part being in contact with the crystal plane.

A crystal oscillation device according to one aspect of the present disclosure includes the crystal oscillating element described above and a package in which the crystal oscillating element is mounted.

A method of manufacturing a crystal oscillating element according to one aspect of the present disclosure includes a first mask forming step, an outer shape etching step, a second mask forming step, a mesa etching step, and a conductive film forming step. The first mask forming step forms a pair of first masks on a pair of major surfaces of a crystal wafer. The outer shape etching step performs wet etching on the crystal wafer through the pair of first masks to thereby form a crystal blank portion. The crystal blank portion includes a pair of major surfaces and side surfaces which include a crystal plane appearing due to the etching and connect the outer edges of the pair of major surfaces to each other. The second mask forming step forms a pair of second masks on the pair of major surfaces of the crystal blank portion from which the pair of first masks have been removed. The mesa etching step performs wet etching on the crystal blank portion through the pair of second masks to thereby form a mesa portion and an outer peripheral portion. The outer peripheral portion surrounds the mesa portion when viewing the pair of major surfaces of the crystal blank portion on a plane and is thinner in the thickness between the pair of major surfaces than the mesa portion. The conductive film forming step forms a pair of excitation electrodes which are respectively located on the pair of major surfaces of the crystal blank portion in the mesa portion and a pair of pads which are located on one of the pair of major surfaces of the crystal blank portion in the outer peripheral portion and are electrically connected with the pair of excitation electrodes. At least one of the pair of second masks includes a mesa mask portion covering a region in the major surface of the crystal blank portion which becomes the mesa portion and an edge mask portion covering at least a portion of an edge part in a major surface of the crystal blank portion. The edge part is in contact with the crystal plane.

DESCRIPTION OF EMBODIMENTS

Figure 1:
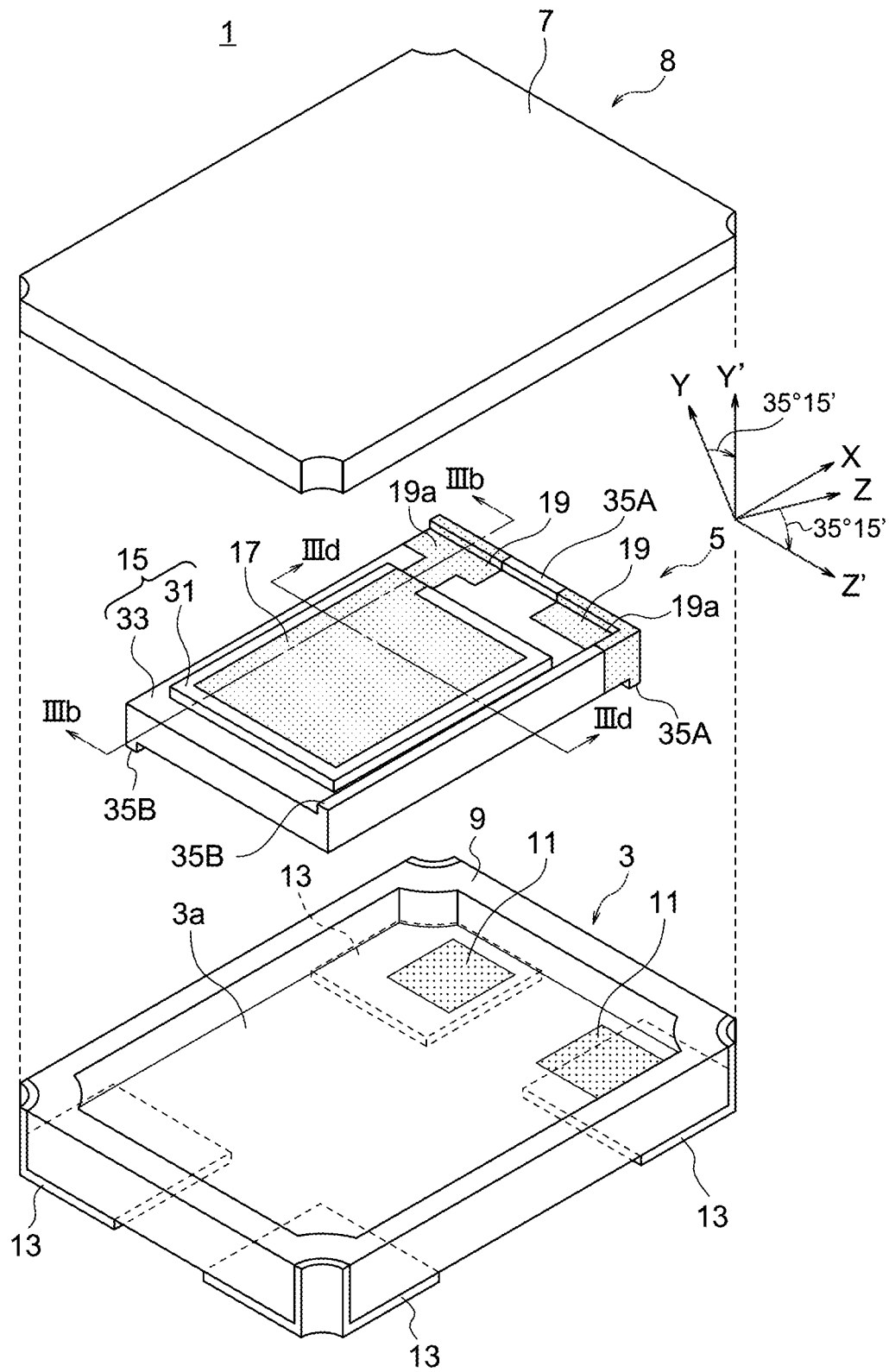
FIG. 1 A disassembled perspective view showing a schematic configuration of a crystal unit according to an embodiment of the present disclosure.

Below, an embodiment of the present disclosure will be explained with reference to the drawings. Note that, the drawings used in the following explanation are schematic ones, and size ratios etc. in the drawings will not always coincide with the actual ones. Further, for convenience, sometimes hatching will be applied to the surface of a layer-shaped member (that is, a surface which is not a cross-section).

In the crystal unit or crystal oscillating element in the present disclosure, any part may be defined as the "upper part" or "lower part". In the following description, for convenience, sometimes use will be made of "upper surface", "lower surface", or other terms where the upper part on the drawing sheet in FIG. 1 and FIG. 2 (+Y'-axis direction) is the upper part. Further, when simply referred to as "viewed on a plane", unless it is particularly explained, it means viewed in the up-and-down direction defined for convenience as described above.

(Overall Configuration of Crystal Unit)

Figure 2:
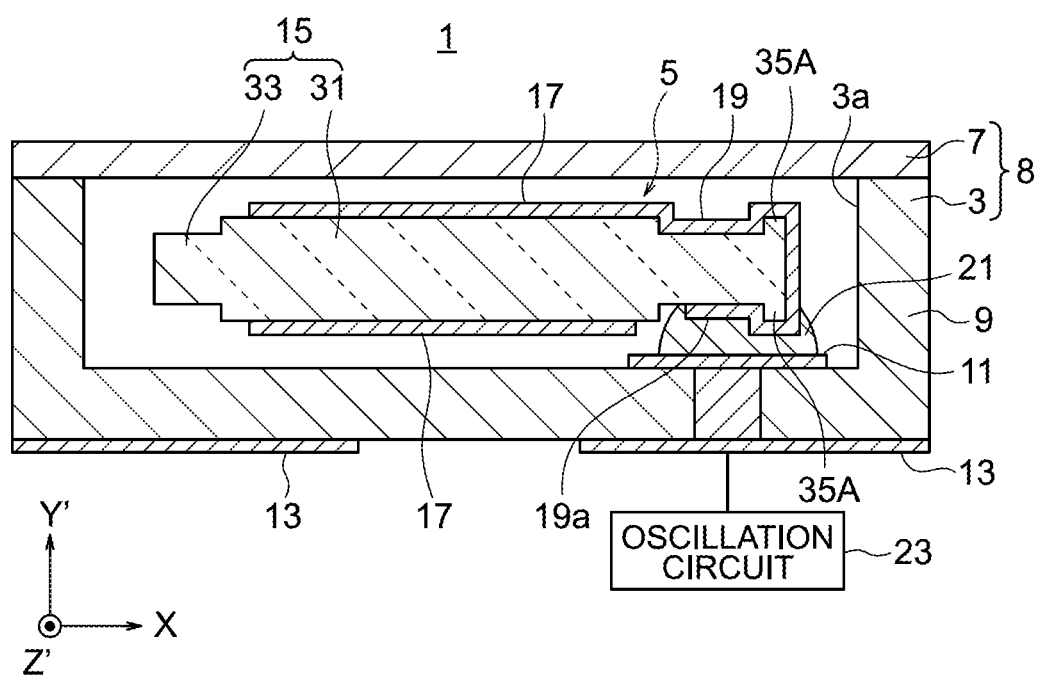
FIG. 2 A cross-sectional view showing the crystal unit in FIG. 1 and corresponding to the IIIb-IIIb line in FIG. 1.

FIG. 1 is a disassembled perspective view showing a schematic configuration of a crystal unit 1 (below, sometimes "crystal" will be omitted) according to an embodiment of the present disclosure. Further, FIG. 2 is a cross-sectional view of the unit 1 (corresponding to the IIIb-IIIb line in FIG. 1).

The unit 1 is for example a substantially thin rectangular cuboid shaped electronic part as a whole. The dimensions thereof may be suitably set. For example, in a relatively small one, the length of the long side (X-axis direction) or short side (Z'-axis direction) is 1 to 2 mm, and the thickness (Y'-axis direction) is 0.2 to 0.4 mm.

The unit 1 has for example an element mounting member 3 in which a recessed portion 3a is formed, a crystal oscillating element 5 (below, sometimes "crystal" will be omitted) accommodated in the recessed portion 3a, and a lid member 7 which closes the recessed portion 3a.

The oscillating element 5 is a portion generating vibration utilized for generation of an oscillation signal. The element mounting member 3 and the lid member 7 configure a package packaging the oscillating element 5. The recessed portion 3a in the element mounting member 3 is sealed by the lid member 7, and the internal portion thereof is for example evacuated or filled with a suitable gas (for example nitrogen).

The element mounting member 3 has for example a base body 9 which becomes the main body of the element mounting member 3, a pair of element mounting pads 11 for mounting the oscillating element 5, and a plurality of (four in the example shown) external terminals 13 for mounting the unit 1 on a not shown circuit board or the like.

The base body 9 is formed by a ceramic or other insulating material and configures the recessed portion 3a. The element mounting pads 11 are configured by a conductive layer made of a metal or the like and are positioned on the bottom surface of the recessed portion 3a. The external terminals 13 are configured by a conductive layer made of a metal or the like and are positioned on the lower surface of the base body 9. The element mounting pads 11 and the external terminals 13 are connected to each other by conductors (FIG. 2; notation is omitted) arranged in the base body 9. The lid member 7 is for example configured by a metal and is joined to the upper surface of the element mounting member 3 by seam welding or the like.

The oscillating element 5 has for example a crystal blank 15, a pair of excitation electrodes 17 for applying voltage to the crystal blank 15, and a pair of extraction electrodes 19 for mounting the oscillating element 5 on the pair of element mounting pads 11. The oscillating element 5 is configured in a substantially plate shape as a whole.

The oscillating element 5 is accommodated in the recessed portion 3a so as to face the bottom surface of the recessed portion 3a. Further, the pair of extraction electrodes 19 are joined to the pair of element mounting pads 11 by a pair of bumps 21 (FIG. 2). Due to this, the oscillating element 5 is supported upon the element mounting member 3 in a cantilever manner. Further, the pair of excitation electrodes 17 are electrically connected with the pair of element mounting pads 11 through the pair of extraction electrodes 19 and consequently are electrically connected with any two of the plurality of external terminals 13. The bumps 21 are for example configured by a conductive adhesive. The conductive adhesive is for example formed by mixing a conductive filler into a thermosetting resin.

The unit 1 configured in this way is for example placed on the mounting surface of a not shown circuit board with the lower surface of the element mounting member 3 facing the board and is mounted on the circuit board by the external terminals 13 being joined to the pads of the circuit board by solder or the like. On the circuit board, for example an oscillation circuit 23 (FIG. 2) is configured. The oscillation circuit 23 applies an AC voltage through the external terminals 13 and element mounting pads 11 to the pair of excitation electrodes 17 to generate an oscillation signal. At this time, the oscillation circuit 23 utilizes for example fundamental wave oscillation in the thickness shear vibration of the crystal blank 15. Overtone vibration may be utilized as well.

(Fundamental Configuration of Crystal Oscillating Element)

The crystal blank 15 is a so-called AT-cut plate. That is, as shown in FIG. 1, it is a plate shape cut parallel to the XZ' plane when, in a quartz crystal, rotating an orthogonal coordinate system XYZ comprised of an X-axis (electrical axis), Y-axis (mechanical axis), and Z-axis (optical axis) by 30° to 40° (35° 15' as an example) around the X-axis to define an orthogonal coordinate system XY'Z'.

Note that, in the present disclosure, when referring to directions parallel to the axes described above, they will be described as the "+X-axis direction" or "−X-axis direction" when differentiating between the positive and negative directions or they will be simply referred to as the "X-axis directions" when not differentiating between the positive and negative directions.

The shape of the outer edge of the crystal blank 15 when viewed on a plane is for example substantially rectangular. The crystal blank 15 has a pair of major surfaces and a plurality of (four in the case of a rectangle when viewed on a plane) side surfaces connecting the outer edges of the pair of major surfaces to each other. The "major surfaces" designate the broadest surfaces (front and back of the plate-shaped member) among the plurality of surfaces (six surfaces in a plate-shape member which is rectangular when viewed on a plane) provided in a plate-shaped member. In the AT-cut plate, the major surfaces are the surfaces that substantially extend along the XZ' plane, the long sides of the major surfaces are the sides which substantially extend along the X-axis, and the short sides of the major surfaces are the sides which substantially extend along the Z'-axis.

Note that, the planar shape of the crystal blank 15 need not be a perfect rectangle. For example, the corner portions of the rectangle may be chamfered to form flat surfaces or curved surfaces, or the long sides and/or short sides may be arc-shaped expanding outward, or the lengths of the two sides facing each other may be made different from each other. The terms the "long side" and "short side" are generally terms designating sides of a rectangle. In the present disclosure, when viewed on a plane, so long as the long direction and the short direction of the crystal blank 15 can be differentiated and the outer edge can be grasped as being comprised of a total of four lines including two lines which substantially extend along the long direction and two lines which substantially extend along the short direction, even if, as described before, a perfect rectangle is not formed, the four lines when viewed on a plane will be referred to as the "long sides" and "short sides".

The crystal blank 15 (oscillating element 5) is configured as a so-called mesa type and has a mesa portion 31 and an outer peripheral portion 33 which surrounds the mesa portion 31 when viewing the major surfaces of the crystal blank 15 on a plane and in which the thickness between the pair of major surfaces (Y'-axis direction) is thinner than the mesa portion 31. By such a shape, for example, an energy confinement effect is improved.

The shape of the mesa portion 31 is for example a plate shape having a pair of major surfaces each of which being parallel to the XZ' plane. The pair of major surfaces are parallel to each other from another viewpoint. The planar shape of the mesa portion 31 may be suitably set. For example, it is rectangular (example shown), circular, elliptical (need not be a correct ellipse defined in mathematics), or oval (a shape where each of the pair of short sides among the four sides is formed in a substantially semicircle). The shown rectangular mesa portion 31 has for example four sides which are substantially parallel to the four sides of the outer edge of the crystal blank 15.

The shape of the outer peripheral portion 33, when ignoring the mesa portion 31, is for example a plate shape having a pair of major surfaces each of which being substantially parallel to the XZ' plane. The pair of major surfaces are parallel to each other from another viewpoint.

The shape of the outer edge of the outer peripheral portion 33 is the same as explained for the shape of the outer edge of the crystal blank 15 explained above as a whole. The shape of the inner edge of the outer peripheral portion 33 is basically the same as the shape of the outer edge of the mesa portion 31.

When viewing the major surfaces on a plane, the mesa portion 31 is, for example, relative to the outer edge of the crystal blank 15 (outer peripheral portion 33), positioned at the center in the Z'-axis direction and is positioned offset to one side in the X-axis direction (opposite side to the extraction electrodes 19). However, the mesa portion 31 may be positioned at the center of the crystal blank 15 in the X-axis direction as well.

In the Y'-axis direction, the outer peripheral portion 33 is positioned at the center of the mesa portion 31. That is, the height of the mesa portion 31 from the outer peripheral portion 33 (amount cut down in the outer peripheral portion for making the crystal blank 15 the mesa type) is equal between the pair of major surfaces of the crystal blank 15.

The pair of major surfaces of the mesa portion 31 are for example finally formed by polishing. Further, the pair of major surfaces of the outer peripheral portion 33, the outer circumferential surface of the mesa portion 31, and the outer circumferential surface of the outer peripheral portion 33 (plurality of side surfaces of the crystal blank 15) are for example formed by etching and are comprised of crystal planes which appear due to the etching.

The thickness of the mesa portion 31 is set based on a desired natural frequency for the thickness shear vibration. For example, where use is made of the fundamental wave oscillation, when the natural frequency is F, the fundamental equation for finding a thickness tm of the mesa portion 31 corresponding to this natural frequency F is tm=1670/F. Note that, in actuality, it is finely adjusted from the value of the fundamental equation considering also the weight of the excitation electrodes 17 etc.

The thickness of the outer peripheral portion 33 is suitably set from the viewpoint of the energy confinement effect and the like. For example, the difference of height between the major surface of the mesa portion 31 and the major surface of the outer peripheral portion 33 (amount cut down in the outer peripheral portion 33) on one side of the pair of major surfaces of the crystal blank 15 is 5% to 15% of the thickness of the mesa portion 31 and is for example about 10%.

The various dimensions of the crystal blank 15 may be suitably set based on simulation computation and experiments etc. from the viewpoint of reduction of the crystal impedance etc. When mentioning one example of the dimensions of the crystal blank 15, for example, the length (X-axis direction) of the crystal blank 15 is 600 μm to 1 mm, the width (Z'-axis direction) of the crystal blank 15 is 500 μm to 700 μm (however, shorter than the length of the crystal blank 15), the thickness of the mesa portion 31 is 40 μm to 70 μm, the length (X-axis direction) of the mesa portion 31 is 450 μm to 750 μm (however, shorter than the length of the crystal blank 15), and the width (Z'-axis direction) of the mesa portion 31 is 400 μm to 650 μm (however, shorter than the length of the crystal blank 15).

The pair of excitation electrodes 17 and pair of extraction electrodes 19 are configured by conductive layers superimposed on the surfaces of the crystal blank 15. The conductive layers are for example Au (gold), Ag (silver), or Au—Ag alloy or another metal. The conductive layers may be configured by pluralities of layers made of materials which are different from each other as well.

The pair of excitation electrodes 17 are positioned on the pair of major surfaces of the mesa portion 31 and face each other while sandwiching the mesa portion 31 therebetween. The planar shapes of the excitation electrodes 17 are for example substantially similar to the planar shape of the mesa portion 31 and are rectangular in the example shown. The excitation electrodes 17 fall into for example the major surfaces of the mesa portion 31. Further, the centers (centers of gravity of figure) thereof coincide with the centers (centers of gravity of figure) of the major surfaces of the mesa portion 31. However, the excitation electrodes 17 may extend from the mesa portion 31 to the outer peripheral portion or the centers of the excitation electrodes 17 and the center of the mesa portion 31 may be offset from each other.

The pair of extraction electrodes 19 for example extend out from the pair of excitation electrodes 17 to one side in the X-axis direction (+X-axis direction in the present embodiment) and have a pair of pad portions 19a which are joined to a pair of bumps 21 on at least one major surface in the pair of major surfaces of the crystal blank 15 (outer peripheral portion 33). In the example shown, the oscillating element 5 is formed so as to be rotationally symmetrical by 180° around the X-axis so that either of the pair of major surfaces may be made to face the bottom surface of the recessed portion 3a. The pair of extraction electrodes 19 have a pair of pad portions 19a on each of the pair of major surfaces (two pairs of pad portions 19a in total). Note that, the excitation electrode 17 positioned on one major surface in the pair of major surfaces and the pad portion 19a positioned on the other major surface are connected through the side surface of the crystal blank 15 (side surface positioned at the short side and/or side surface positioned at the long side).

(Projecting Portions of Crystal)

The crystal blank 15 has two short-side projecting portions 35A and two long-side projecting portions 35B (below, sometimes simply referred to as the "projecting portions 35") which protrude from the major surfaces of the outer peripheral portion 33 at the edge parts of the major surfaces.

Note that, these projecting portions 35 may be grasped as portions of the outer peripheral portion 33 as well. In the following explanation, however, for convenience, they will be basically expressed as portions different from the outer peripheral portion 33. Further, when referring to the projecting portions 35 being positioned at the edge parts in the major surfaces of the crystal blank 15 (outer peripheral portion 33) which are in contact with the side surfaces (crystal planes), for example, the projecting portions 35 are in contact with the side surfaces (crystal planes) of the crystal blank 15 (from another viewpoint, the side surfaces of the projecting portions 35 configure portions of the major surface sides of the crystal blank 15 in the side surfaces of the crystal blank 15), and portions of the major surfaces of the crystal blank 15 (surfaces parallel to the XZ' plane) are not positioned between the projecting portions 35 and the side surfaces of the crystal blank 15.

The two short-side projecting portions 35A are positioned on the pair of major surfaces of the crystal blank 15. Further, the short-side projecting portions 35A are positioned at the short sides in the +X-axis direction on the major surfaces. The shapes of the short-side projecting portions 35A are for example projecting rim shapes extending along the short sides described above. The lengths of the short-side projecting portions 35A extending along the short sides may be suitably set, but are for example 80% or more of the lengths of the short sides. In the example shown, they are equal to the lengths of the short sides.

The two long-side projecting portions 35B are positioned on the pair of major surfaces of the crystal blank 15. Between the two long-side projecting portions 35B, the long-side projecting portion 35B positioned on the major surface facing the +Y'-axis direction is positioned at the long side in the +Z'-axis direction. The long-side projecting portion 35B positioned on the major surface facing the −Y'-axis direction between the two long-side projecting portions 35B is positioned at the long side in the −Z'-axis direction. The shapes of the long-side projecting portions 35B are for example projecting rims shapes extending along the long sides described above. The lengths of the long-side projecting portions 35B extending along the long sides may be suitably set. They are for example 80% or more of the lengths of the long sides. In the example shown, they are equal to the lengths of the long sides.

The pair of extraction electrodes 19, in the present embodiment, are led out from the pair of excitation electrodes 17 to the side in the X-axis direction, on which the short-side projecting portions 35A are provided. The pad portions 19a are for example formed covering not only the major surfaces of the outer peripheral portion 33, but also the side surfaces of the short-side projecting portions 35A which face the X-axis direction (from another viewpoint, face the mesa portion 31 side), the top surfaces, and the side surfaces facing the +X-axis direction (from another viewpoint, the opposite sides from the mesa portion 31). However, the pad portions 19a may be formed covering only the major surfaces of the outer peripheral portion 33 as well.

(Crystal Planes of Crystal Blank)

The crystal blank 15, as will be explained in detail later, for example, is formed by etching a crystal wafer from which a plurality of crystals 15 can be obtained. Further, the pair of major surfaces of the mesa portion 31 is configured by the pair of major surfaces of the crystal wafer. The side surfaces of the mesa portion 31 and the side surfaces of the outer peripheral portion 33 are formed by the crystal planes appearing by etching. Note that, in FIG. 1 and FIG. 2, the side surfaces of the crystal blank 15 were shown while ignoring inclinations of the crystal planes.

Figure 3A:
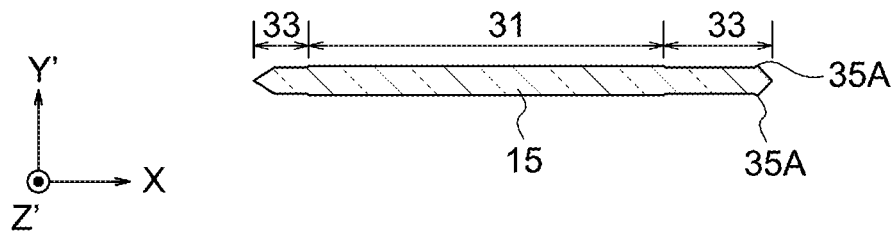
FIG. 3A is a cross-sectional view showing a crystal oscillating element and corresponding to the IIIb-IIIb line in FIG. 1.

FIG. 3A is a cross-sectional view showing the oscillating element 5 and corresponding to the IIIb-IIIb line in FIG. 1. FIG. 3C is a cross-sectional view corresponding to the IIId-IIId line in FIG. 1.

These views show the oscillating element 5 while making the ratios of various dimensions of the oscillating element 5 closer to the actual ones as much as possible. As shown in these views, when showing them in actual dimensional ratios, illustration or visual confirmation of the mesa portion 31, projecting portions 35, crystal planes, and the like is difficult. This is because, for example, the thickness of the mesa portion 31 is smaller in comparison with the dimensions in the planar direction of the crystal blank 15 (for example, the thickness of the mesa portion 31 is less than 10% of the length of the crystal blank 15), and the amount cut down of the outer peripheral portion 33 with respect to the mesa portion 31 is small relative to the thickness of the mesa portion 31 (for example the amount cut down is about 10% of the thickness of the mesa portion 31). Further, the thicknesses of the excitation electrodes 17 and rest of the conductive layers are small in comparison with the thickness of the crystal blank 15 (for example the thicknesses of the conductive layers are 1% or less of the thickness of the mesa portion 31).

Figure 3B:
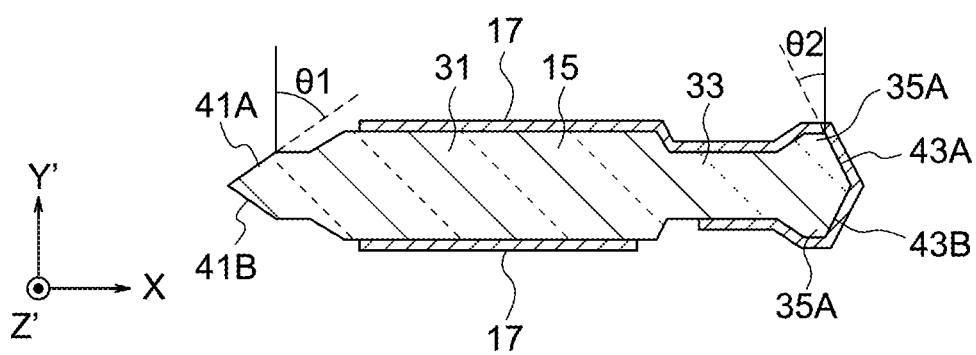
FIG. 3B is a view schematically showing FIG. 3A.
Figure 3C:
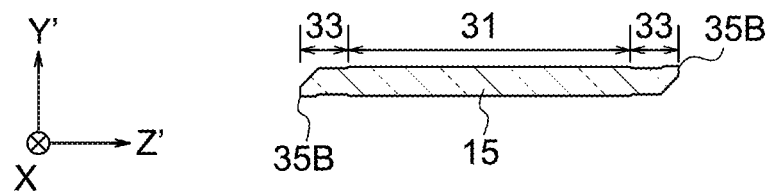
FIG. 3C is a cross-sectional view showing the crystal oscillating element and corresponding to the IIId-IIId line in FIG. 1.
Figure 3D:
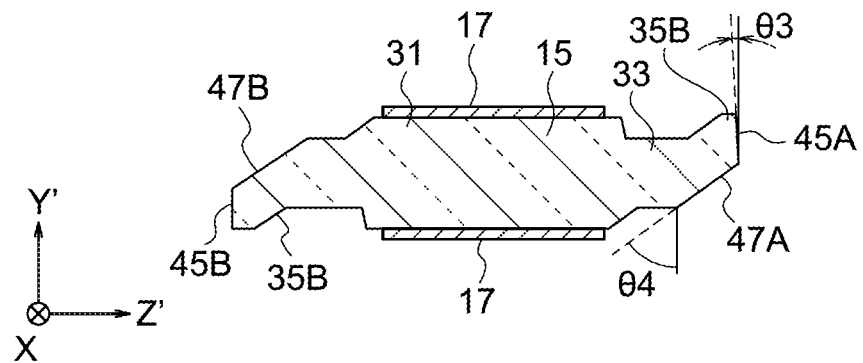
FIG. 3D is a view schematically showing FIG. 3C.

Therefore, in the following description, as shown in FIG. 3B and FIG. 3D, the cross-sectional views corresponding to the IIIb-IIIb line and IIId-IIId line in FIG. 1 will be shown with size ratios which are different from the actual size ratios.

In these views, in comparison with the actual dimensional ratios, the dimensions in the thickness direction are made larger relative to the dimensions in the planar direction. Further, relative to the thickness of the mesa portion 31, the amount cut down of the outer peripheral portion 33 with respect to the mesa portion 31 is made larger. On the other hand, the inclination angles (for example θ1 to θ4) of the crystal planes are shown so as to be closer to the actual ones as much as possible. Although the thicknesses are made larger in comparison with the dimensions in the planar direction, the inclination angles of the crystal planes are made closer to the actual ones, therefore areas of the crystal planes become broader. Further, the areas of the major surfaces of the mesa portion 31 or outer peripheral portion 33 are reduced by that amount. The thicknesses of the conductive layers are made greater in comparison with the thickness of the crystal blank 15.

As shown in FIG. 3B, on the cross-section perpendicular to the Z'-axis, the shape of the crystal blank 15 after considering the crystal planes becomes a shape that is linearly symmetrical with a not shown axis of symmetry which is substantially parallel to the X-axis.

The side surface positioned in the −X-axis direction of the crystal blank 15 (outer peripheral portion 33) is configured by for example two crystal planes 41A and 41B (below, sometimes "A" and "B" will be omitted). The inclination angle θ1 relative to the Y'-axis of the crystal planes 41 is for example about 55° (for example 53° to 57°). The position in the Y'-axis direction of the ridge at which the two crystal planes 41A and 41B intersect with each other for example substantially coincides with the center of the thickness of the mesa portion 31.

The side surface positioned in the +X-axis direction of the crystal blank 15 (outer peripheral portion 33 and short-side projecting portion 35A) is configured by for example two crystal planes 43A and 43B (below, sometimes "A" and "B" will be omitted). The inclination angle θ2 relative to the Y'-axis of the crystal planes 43 is for example about 27° (for example 25° to 29°). The position in the Y'-axis direction of the ridge at which the two crystal planes 43A and 43B intersect with each other for example substantially coincides with the center of the thickness of the mesa portion 31.

The side surface in the +X-axis direction of the short-side projecting portion 35A becomes for example flush (configures one flat surface) with a side surface of the outer peripheral portion 33 and is configured by the crystal plane 43. Such a shape may be said to be one of the shapes where the short-side projecting portion 35A is provided in the edge part in the major surface of the crystal blank 15 which is in contact with the crystal plane 43. However, the short-side projecting portion 35A is relatively small in its height and is the portion in contact with the etching mask, therefore the crystal plane does not always clearly appear at the short-side projecting portion 35A. For example, the side surface in the +X-axis direction of the short-side projecting portion 35A sometimes becomes a shape like a curved chamfered surface.

Although notations are not particularly attached, the side surface in the −X-axis direction of the mesa portion 31 and the side surface in the −X-axis direction of the short-side projecting portion 35A are for example configured by crystal planes 41. The side surface in the +X-axis direction of the mesa portion 31 is for example configured by the crystal plane 43. However, in the same way as the side surface in the +X-axis direction of the short-side projecting portion 35A, the crystal plane does not always clearly appear.

As shown in FIG. 3D, on the cross-section perpendicular to the X-axis, the shape of the crystal blank 15 considering the crystal planes becomes a shape that is rotationally symmetrical by 180° relative to a not shown symmetric axis which is substantially parallel to the X-axis.

A side surface positioned in the −Z'-axis direction of the crystal blank 15 (outer peripheral portion 33 and long-side projecting portion 35B) is for example configured by two crystal planes 45B and 47B (below, sometimes "B" will be omitted). Further, a side surface positioned in the +Z'-axis direction of the crystal blank 15 (outer peripheral portion 33 and long-side projecting portion 35B) is for example configured by two crystal planes 45A and 47A (below, sometimes "A" will be omitted).

The inclination angle θ3 relative to the Y'-axis of the crystal plane 45 is for example about 3° (for example, 1° to 5°). The inclination angle θ4 relative to the Y'-axis of the crystal plane 47 is for example about 54° (for example, 52° to 56°). The position in the Y'-axis direction of the ridge at which the two crystal planes 45 and 47 intersect with each other may be suitably set. For example, this is a position which substantially coincides with the center of the thickness of the mesa portion 31 or is offset somewhat from the center.

The side surface of the long-side projecting portion 35B which is on the side opposite to the mesa portion 31 becomes for example flush (configures one flat surface) with the side surface of the outer peripheral portion 33 and is configured by the crystal plane 45. Such a shape may be said to be one of the shapes where the long-side projecting portion 35B is provided in the edge part in the major surface of the crystal blank 15 which is in contact with the crystal plane 45. Note that, in the same way as the short-side projecting portion 35A, the crystal plane does not always clearly appear at the long-side projecting portion 35B.

Although notations are not particularly attached, the side surface in the +Y'-axis direction and +Z'-axis direction of the mesa portion 31 and the side surface in the −Y'-axis direction and −Z'-axis direction of the mesa portion 31 are for example configured by the crystal planes 45. The side surface in the +Y'-axis direction and −Z'-axis direction of the mesa portion 31, the side surface in the −Y'-axis direction and +Z'-axis direction of the mesa portion 31, and the side surface on the mesa portion 31 side of the long-side projecting portion 35B are configured by for example the crystal planes 47. Note that, in the same way as the other plane in which the length in the Y'-axis direction is relatively small as explained above, the crystal plane does not always clearly appear.

(Outline of Method of Manufacturing Crystal Oscillating Element)

Figure 4:
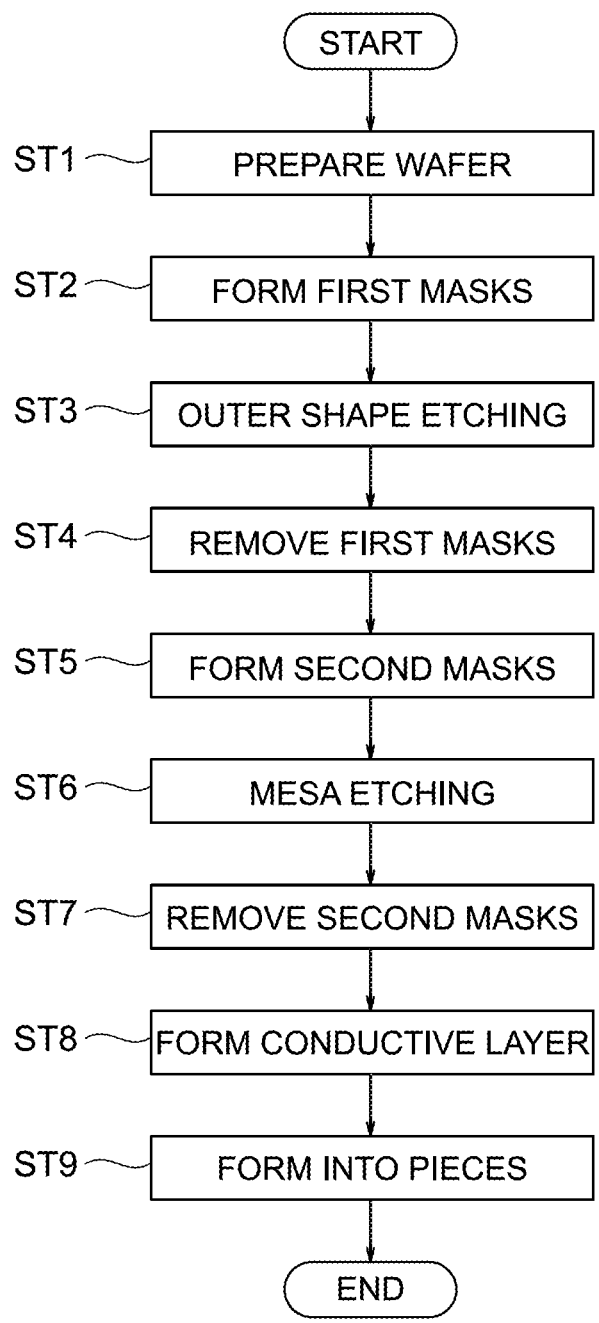
FIG. 4 A flow chart showing an example of the procedure of a method of manufacturing a crystal oscillating element according to the embodiment in brief.
Figure 5A:
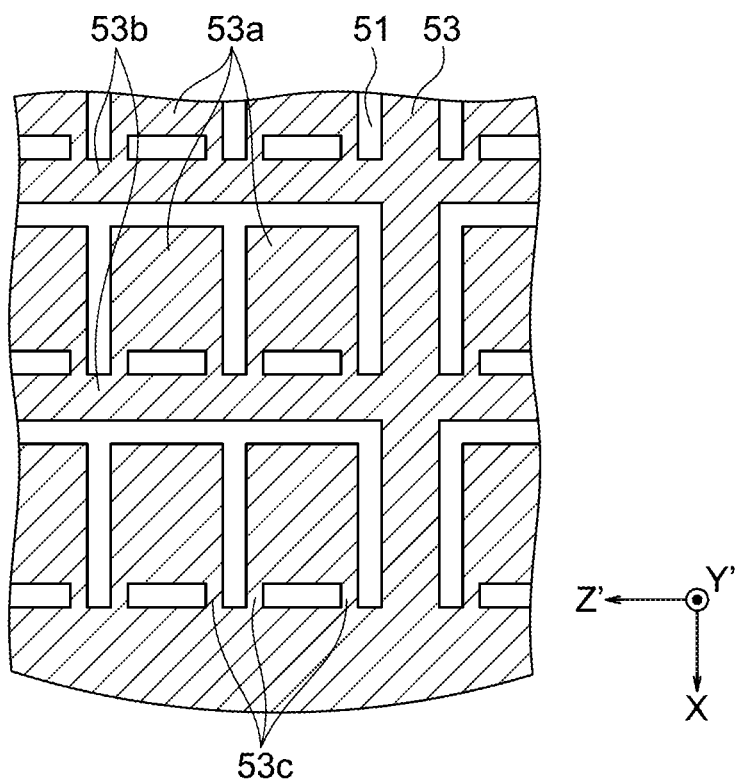
FIG. 5A is a plan view showing patterns of a first mask.
Figure 5B:
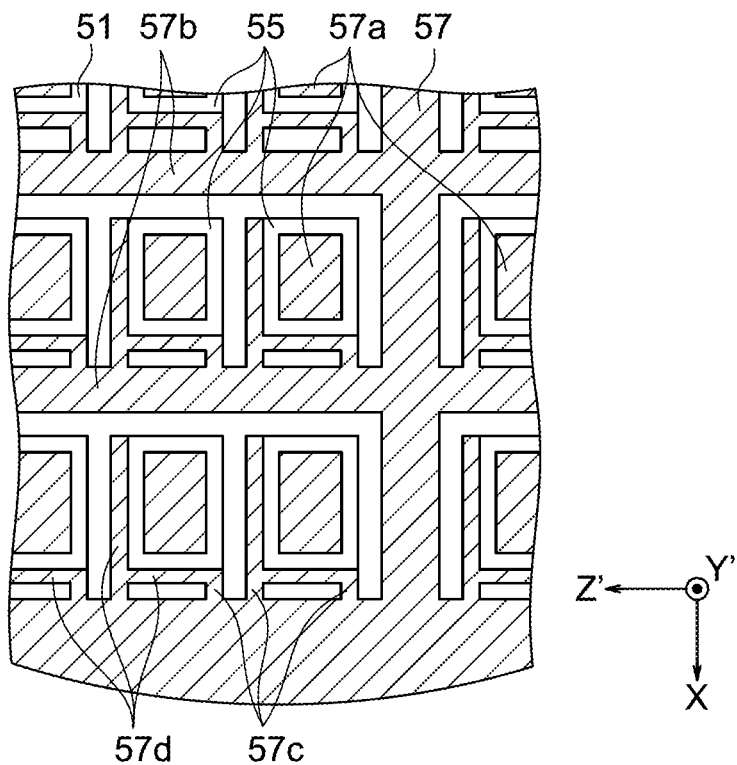
FIG. 5B is a plan view showing patterns of a second mask.

FIG. 4 is a flow chart showing an example of the procedure of the method of manufacturing the oscillating element 5. Further, FIG. 5A and FIG. 5B are plan views showing a portion of a wafer 51 from which a plurality of crystals 15 can be obtained. Note that, in the following description, even if the shapes etc. of the members change along with the advance of the manufacturing process, sometimes the same notations will be used before and after the change.

At step ST1, a wafer 51 made of quartz crystal is prepared. Note that, it is sufficient that the "wafer" referred to here be a plate shape one from which multiple crystals 15 can be taken and need not be disk shaped. For example, the planar shape of the wafer 51 may be rectangular as well.

The wafer 51 may be prepared for example in the same way as the known method. Specifically, for example, by lumbering and slicing an artificial crystal, wafers are cut out at the angles explained with reference to FIG. 1. Further, by lapping, etching, and/or polishing a cut-out wafer, a wafer 51 having a pair of major surfaces which are parallel to each other is formed.

At step ST2, as shown in FIG. 5A, the pair of major surfaces of the wafer 51 are formed with first masks 53 (regions indicated by hatching) for etching of the wafer 51. The first masks 53 are used for etching for forming the outer shapes of the crystals 15 (side surfaces of the outer peripheral portions 33) and have pluralities of outer shape mask portions 53a having substantially the same planar shapes as the planar shapes of the crystals 15, frames 53b positioned among the pluralities of outer shape mask portions 53a, and pluralities of connection parts 53c which connect the pluralities of outer shape mask portions 53a and the frames 53b. The connection parts 53c are for example connected with respect to the outer shape mask portions 53a at positions corresponding to the two ends of the short sides in the +X-axis direction (from another viewpoint, the extraction electrode 19 sides).

The first masks 53 are configured by for example combinations of metal films and resist films superimposed over them. The metal films are for example comprised of chromium. The resist films may be either of positive type or negative type photoresists. These may be formed in the same way as the known method. For example, first, by a sputtering process or the like, metal films are formed on the major surfaces of the wafer 51 over their entire surfaces. Next, the spin coating method or the like is used to form resist films on the metal films over their entire surface. Next, the resist films are patterned by photolithography to the shapes shown in FIG. 5A. Next, the metal films are etched through the resist films to pattern the metal films to the shapes shown in FIG. 5A. Due to this, the first masks 53 are formed. Note that, after that, the resist films may be removed so that the first masks 53 are configured by only the metal films.

At step ST3, wet etching is carried out with respect to the wafer 51 through the first masks 53. For example, the wafer 51 is immersed in a liquid tank containing a chemical solution. This etching is carried out just below the openings of the first masks 53 up to formation of through holes in the wafer 51. Due to this, a plurality of crystal blank portions 55 (FIG. 5B) having substantially the same planar shapes as the planar shapes of the crystals 15 are formed just below the outer shape mask portions 53a. Note that, the plurality of crystal blank portions 55 are connected to each other through the portions just below the connection parts 53c and frames 53b in the wafer 51.

At step ST4, the first masks 53 are removed from the wafer 51. For example, the wafer 51 is dipped in a suitable liquid chemical solution for removing the first masks 53.

At step ST5, as shown in FIG. 5B, the pair of major surfaces of the wafer 51 are formed with second masks 57 (regions indicated by hatching) for etching of the crystal blank portions 55. The second masks 57 are used for etching for forming the crystal blank portions 55 to the mesa types and have pluralities of mesa mask portions 57a having substantially the same planar shapes as the planar shapes of the mesa portions 31 and frames 57b and connection parts 57c having the same shapes as those of the frames 53b and connection parts 53c in the first masks 53. Further, the second masks 57 have pluralities of edge mask portions 57d having substantially the same planar shapes as the planar shapes of the projecting portions 35. Note that, the method of formation of the second masks 57 may be for example the same as the known method. Specifically, for example, the second masks 57 are formed by patterning of the resist films by the known method.

At step ST6, wet etching is carried out with respect to the wafer 51 through the second masks 57. For example, the wafer 51 is immersed in a liquid tank containing a chemical solution. This etching, unlike step ST3, is carried out just below the openings of the second masks 57 until the etching amounts of the crystal blank portions 55 (amounts cut down of the outer peripheral portions 33) reach the desired values. Further, the crystal blank portions 55 are cut down in the regions which become the outer peripheral portions 33 whereby the mesa portions 31 and outer peripheral portions 33 are formed. Further, the second masks 57 have the edge mask portions 57d, therefore also the projecting portions 35 are formed.

At step ST7, the second masks 57 are removed from the wafer 51. For example, the wafer 51 is immersed in a suitable chemical solution for removing the second masks 57.

At step ST8, each crystal blank portion 55 is formed with a pair of excitation electrodes 17 and a pair of extraction electrodes 19. The method of formation of conductive layers of these may be for example the same as the known method. Specifically, for example, the conductive layers of these are formed by formation of films of a conductive material through masks or are formed by formation of films of a conductive material, then etching through masks.

At step ST9, the plurality of crystal blank portions 55 are separated from the portions in the wafer 51 positioned right below the frames 57b of the second masks 57. For example, the crystal blank portions 55 are pressed or sucked to break the portions in the wafer 51 positioned right below the connection parts 57c of the second masks 57. Due to this, a plurality of oscillating elements 5 formed into individual pieces are prepared.

(Formation of Crystal Planes)

The changes of the cross-sectional shape of a crystal blank portion 55 (crystal blank 15) in the outer-shape etching at step ST3 and mesa etching at step ST6 will be explained next. In the following explanation, basically illustration and explanation of the undercut for making the etching advance right below the mask as well will be omitted.

First, before the explanation of the crystal blank portion 55 according to the embodiment, changes of the cross-sectional shape of a crystal blank portion 155 according to a comparative example will be explained. In the explanation of changes of the cross-sectional shape according to the embodiment, basically only the portion different from the comparative example will be explained.

(Changes of Shape of XY' Cross-Section According to Comparative Example)

Figure 6A:
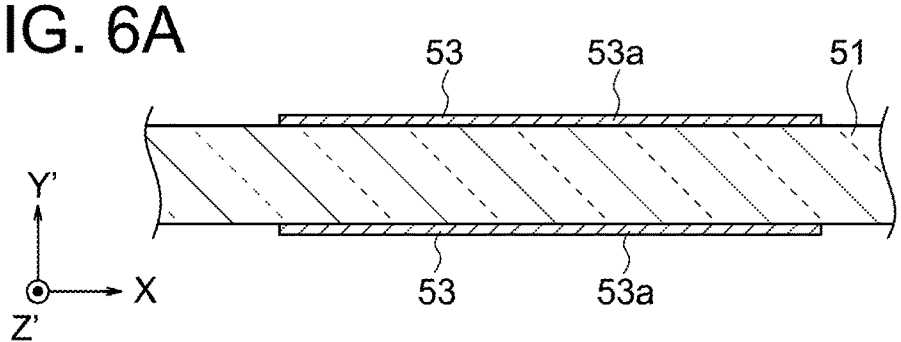
FIG. 6A, FIG. 6B, FIG. 6C, FIG. 6D, and FIG. 6E are views showing changes of cross-sectional shape of a crystal blank portion according to a comparative example and corresponding to the IIIb-IIIb line in FIG. 1.
Figure 6B:
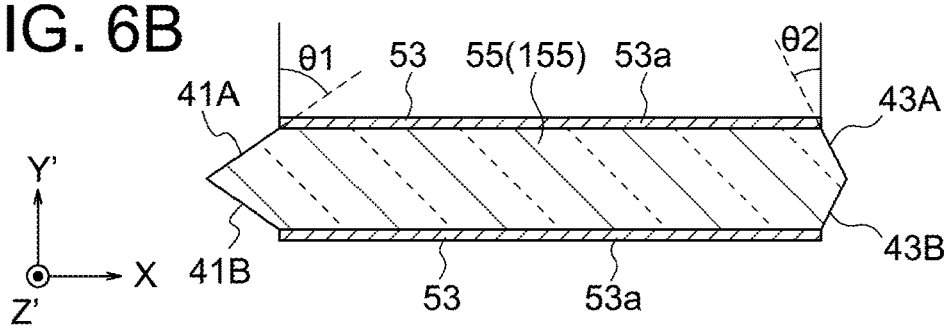

FIG. 6A to FIG. 6E are views showing changes of the cross-sectional shape of the crystal blank portion 155 according to the comparative example and correspond to the IIIb-IIIb line in FIG. 1. Note that, FIG. 6A and FIG. 6B are views which are common between the embodiment and comparative example. In these views, basically notations in the embodiment will be attached. Notations of the comparative example will be attached in parentheses according to need.

FIG. 6A shows a state where the pair of first masks 53 are formed on the pair of major surfaces of the wafer 51 (step ST2). Between the pair of first masks 53, the positions of the edge parts in the X-axis direction of the outer shape mask portions for example coincide with each other.

FIG. 6B shows a state where the wafer 51 is etched through the first masks 53 to form the crystal blank portion 155 (55) (step ST3). At this time, at the side surfaces corresponding to the short sides of the crystal blank portion 155 (55), the crystal planes 41 and 43 explained with reference to FIG. 3B appear.

Figure 6C:
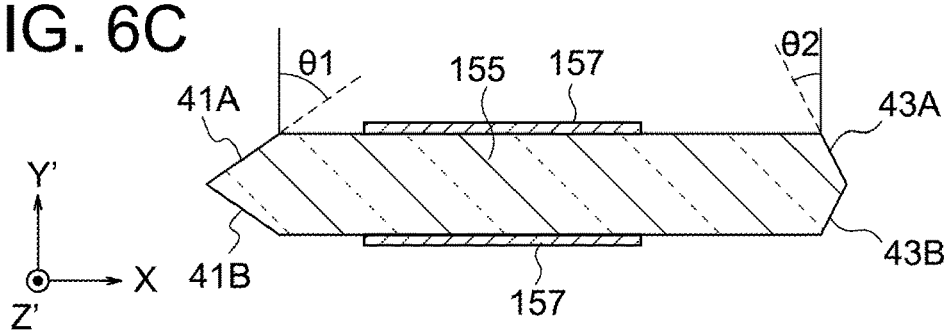

FIG. 6C shows a state where a pair of second masks 157 are formed on the pair of major surfaces of the wafer 51 (corresponding to step ST5). The second masks 157 are basically different from the second masks 57 in the embodiment only in the point that the edge mask portions 57d are not provided.

Figure 6D:
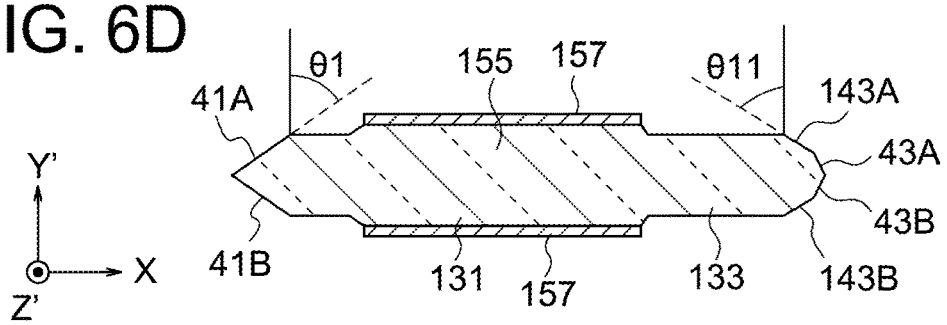

FIG. 6D shows a state where etching of the crystal blank portion 155 through the second masks 157 (corresponding to step ST6) is started. The outer peripheral portion 133 of the crystal blank portion 155 is etched on its pair of major surfaces and on the two side surfaces in the X-axis direction. Accordingly, the outer peripheral portion 133 becomes thinner than the mesa portion 131 and the length (X-axis direction) of the crystal blank portion 155 becomes shorter.

The side surface in the −X-axis direction of the outer peripheral portion 133 is still configured by two crystal planes 41. On the other hand, on the side surfaces in the +X-axis direction, in addition to the two crystal planes 43, new crystal planes 143A and 143B (below, sometimes "A" and "B" will be omitted) appear. The crystal planes 143 are positioned closer to the major surface side relative to the crystal planes 43. The inclination angle θ11 of the crystal planes 143 relative to the Y'-axis direction is for example about 58° (for example 56° to 60°).

Figure 6E:
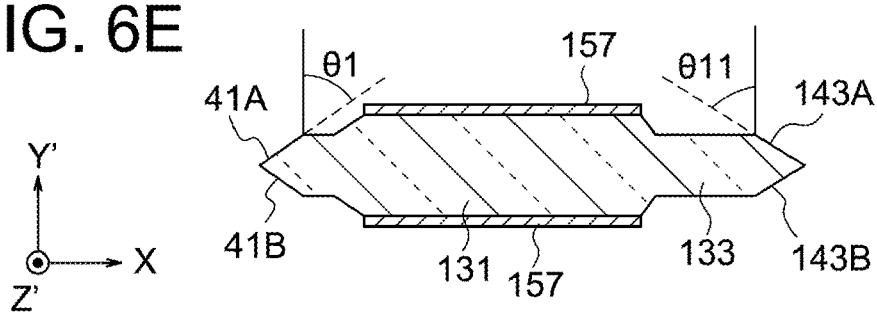

FIG. 6E shows a state where etching of the crystal blank portion 155 through the second masks 157 (corresponding to step ST6) further advances. Relative to FIG. 6D, the outer peripheral portion 133 becomes further thinner, and the length of the crystal blank 155 becomes further shorter.

The side surface in the −X-axis direction of the outer peripheral portion 133 is still configured by the two crystal planes 41. On the other hand, on the side surface in the +X-axis direction, the crystal planes 43 no longer appear. The side surface is configured by the two crystal planes 143.

Note that, depending on the dimensions and/or etching conditions (for example etching time) of the crystal blank portion 155, if the mesa etching advances, sometimes a new crystal plane will appear also in the −X-axis direction (for example with an inclination angle relative to the Y'-axis of about 25°) or a further new crystal plane will appear in the +X-axis direction (for example with an inclination angle relative to the Y'-axis of about 86).

When designing and/or measuring the length of the crystal blank 15 (crystal blank portions 55 and 155) in the X-axis direction, for example, the length at the position at which it becomes the longest is made the standard. For example, in FIG. 6C, the length of the crystal blank portion 155 is defined using the position in the X-axis direction of the ridge formed by the two crystal planes 41 and the position in the X-axis direction of the ridge formed by the two crystal planes 43 as the standard.

In FIG. 6D as well, in the same way as FIG. 6C, the length of the crystal blank portion 155 is defined using the position in the X-axis direction of the ridge formed by the two crystal planes 41 and the position in the X-axis direction of the ridge formed by the two crystal planes 43 as the standard. On the other hand, in FIG. 6E, in the same way as FIG. 6C and FIG. 6D, the standard of the −X-axis direction is the position of the ridge formed by the two crystal planes 41. However, the standard of the +X-axis direction becomes the position of the ridge formed by the two new crystal planes 143. Further, the etching speed in the X-axis direction of the crystal plane differs according to the type of the crystal plane.

Accordingly, on the side surface of the outer peripheral portion 133, if the two crystal planes 43 disappear and the ridge is formed by the two new crystal planes 143, the rate of change of the length of the crystal blank portion 155 due to the etching changes from the rate of change before the two crystal planes 43 disappear.

Figure 7:
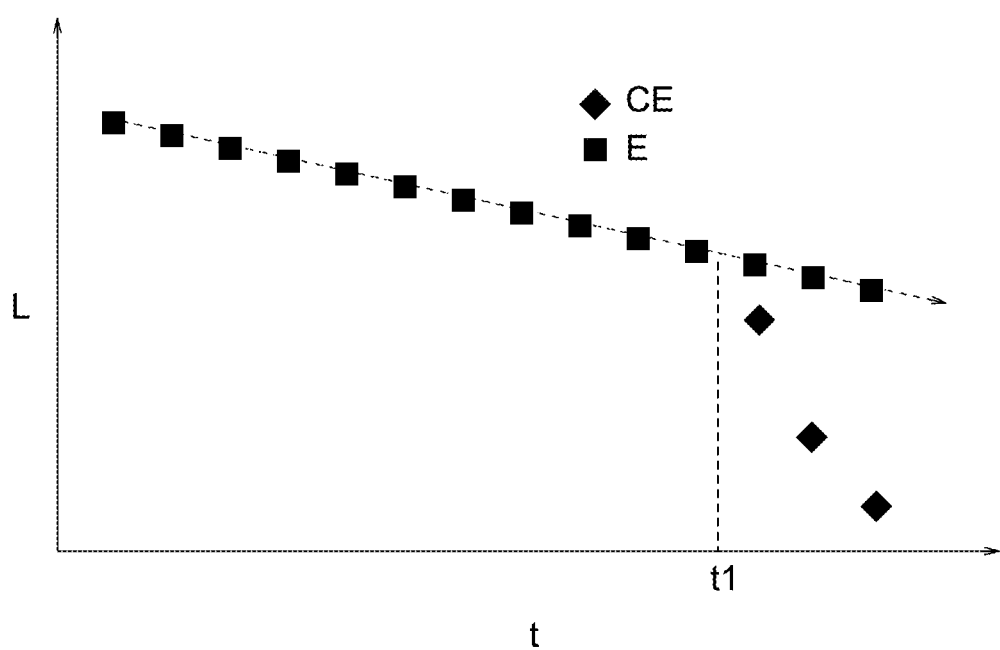
FIG. 7 A graph showing the relationship between an etching time and a change of length of the crystal blank portion.

FIG. 7 is a graph showing the relationship between the etching time and the change of length of the crystal blank portion 155 (55). An abscissa "t" shows the etching time, and an ordinate L shows the length of the crystal blank portion 155 (55). In the graph, marks indicated by the notation E show changes of the length L when assuming that the state where the crystal planes 43 appearing is maintained. The marks indicated by the notation CE show changes of the length L when assuming that the crystal planes 43 disappear in the middle of the mesa etching as in the comparative example. This graph is obtained from simulation computations.

As shown in this graph, in the case where the crystal planes 43 are maintained, the rate of change of the length L relative to the etching time "t" is substantially constant. On the other hand, when the crystal planes 43 disappear at the time t1, the rate of change of the length L relative to the etching time "t" becomes for example larger.

The length L of the crystal blank 15 exerts an influence upon the characteristics of the oscillating element 5 such as the crystal impedance. However, if the rate of change of the length L changes in the middle of the etching as in the comparative example, it becomes difficult to adjust the length L of the crystal blank 15 according to the etching time.

(Change of Shape of XY' Cross-Section According to Embodiment)

Figure 8A:
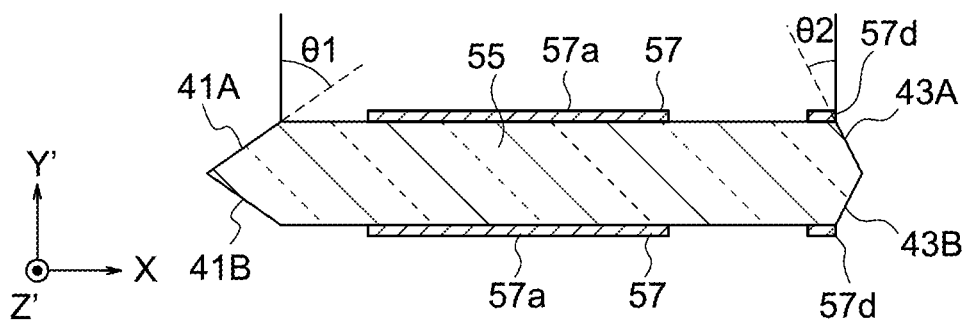
FIG. 8A, FIG. 8B, and FIG. 8C are views showing changes of cross-sectional shape of the crystal blank portion according to an embodiment and corresponding to the IIIb-IIIb line in FIG. 1.
Figure 8B:
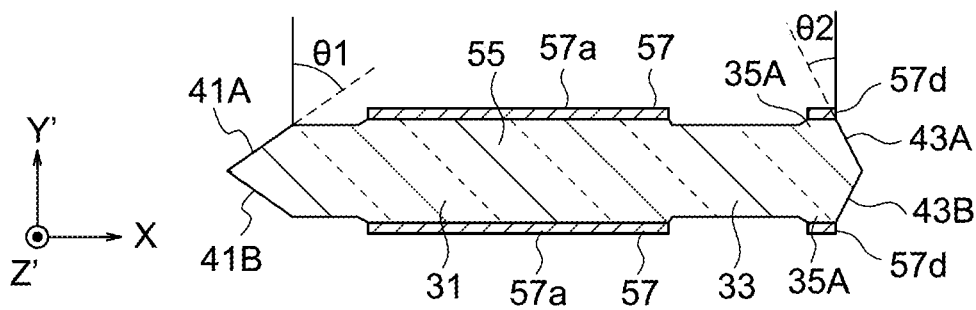
Figure 8C:
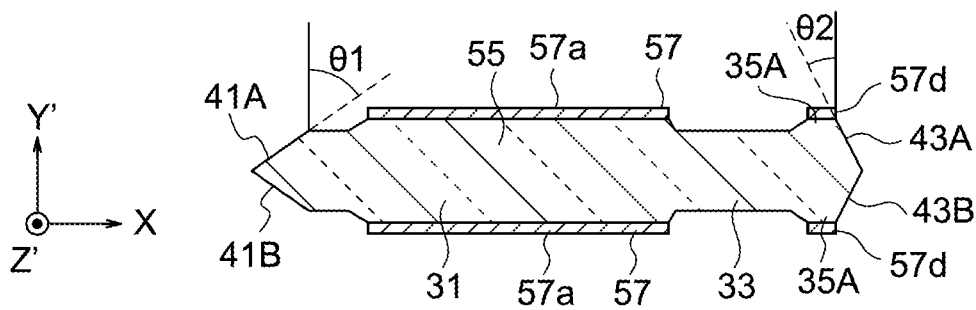

FIG. 8A to FIG. 8C are views showing changes of the cross-sectional shape of the crystal blank portion 55 according to the embodiment and correspond to FIG. 6C to FIG. 6E according to the comparative example. It is already explained that FIG. 6A and FIG. 6B show also changes of the cross-sectional shape in the embodiment.

FIG. 8A shows a state where the second masks 57 are formed (step ST5). The second masks 57 have edge mask portions 57d corresponding to the short-side projecting portions 35A. The edge mask portions 57d are for example positioned at the edge parts of the major surfaces of the crystal blank portion 55 which are in contact with the crystal planes 43. Between the pair of second masks 57, the positions of the edge parts in the X-axis direction of the mesa mask portions 57a and the edge mask portions 57d coincide with each other.

FIG. 8B shows a state where the etching of the crystal blank portion 55 through the second masks 57 (step ST6) is started. The second masks 57 have the edge mask portions 57d, therefore the etching on the side surface in the +X-axis direction advances in the same way as the etching through the first masks 53 (step ST3). Accordingly, for example, the crystal planes 143 in the comparative example do not appear, but the state of the side surface in the +X-axis direction being configured by the two crystal planes 43 is maintained.

FIG. 8C shows a state where the etching of the crystal blank portion 55 through the second masks 57 (step ST6) further advances (for example a state where etching is completed). In contrast to FIG. 8B, the outer peripheral portion 33 becomes further thinner and the length of the crystal blank portion 55 becomes further shorter. However, the crystal planes 43 are maintained. The outer peripheral portion 33 is cut down deeper than the short-side projecting portions 35A, and short-side projecting portions 35A having heights relative to the outer peripheral portion 33 equal to that of the mesa portion 31 are formed.

By the crystal planes 43 being maintained in this way, for example, the change of the rate of change of the length L relative to the etching time is suppressed. That is, the rate of change of the length L as indicated by the marks of notation E in FIG. 7 is obtained.

Note that, it was explained that FIG. 6A and FIG. 6B are common between the comparative example and the embodiment. However, between the comparative example and the embodiment, the etching speeds of the side surfaces in the +X-axis direction are different, therefore the dimensions of the outer shape mask portions 53a of the first masks 53 may be different from each other. For example, in the embodiment, in comparison with the comparative example, the lengths in the X-axis direction of the outer shape mask portions 53a may be shorter.

In the present disclosure, illustration of undercut is omitted (ideal etching is shown). Therefore, in FIG. 8A to FIG. 8C, the etching of the side surface in the +X-axis direction does not advance, and the length L changes due to only the etching of the side surface in the −X-axis direction. Note that, in actuality, the etching may advance also from the +X-axis direction by undercut to change the length L as well.

By advance of undercut, the whole parts right below the edge mask portions 57d may be etched somewhat as well. In this case, the heights of the short-side projecting portions 35A from the major surfaces of the outer peripheral portion 33 become lower than the height of the mesa portion 31. From another viewpoint, by suitably setting the widths (X-axis direction concerning the short-side projecting portions 35A) of the edge mask portions 57d, the heights of the short-side projecting portions 35A can be adjusted up to a range of not more than the height of the mesa portion 31.

By undercut advancing as described above, the crystal planes 143 may appear as well. In this case, the crystal planes 143 may be positioned only on the side surfaces of the short-side projecting portions 35A (part or whole) or may extend up to the side surface of the outer peripheral portion 33. Note that, when the crystal planes 143 are positioned on the entire side surfaces of the short-side projecting portions 35A and do not extend over the side surface of the outer peripheral portion 33, a configuration where the short-side projecting portions 35A contact the crystal planes 43, but their side surfaces do not to become flush with the crystal planes 43 is obtained. Further, when the crystal planes 143 extend up to the side surface of the outer peripheral portion 33, the short-side projecting portions 35A end up contacting the crystal planes 143 between the crystal planes 43 and 143 which configure the side surface of the outer peripheral portion 33.

In the manufacturing method of the present disclosure, the short-side projecting portions 35A need not finally remain either. Even in this case, for example, if the crystal planes 43 finally remain, the effect of keeping the rate of change of the length L relative to the etching time constant is obtained.

Concerning the manufacturing method of the present disclosure, when saying that the edge mask portions 57d are positioned at the edge parts of the major surfaces of the crystal blank portion 55 which are in contact with the crystal planes (for example, the crystal planes 43 or 45), for example, there may be some offset between the edge mask portions 57d and the crystal planes as well. For example, there may be offset of not more than 10 µm or not more than 2% of the length of the crystal blank 15 as well. Even if the edge mask portions 57d extends somewhat to the crystal plane 43 side or even if there is no such offset, in any case, the fact the undercut advances. Conversely, even if the edge mask portions 57d are spaced somewhat from the crystal planes 43 and two new crystal planes 143 appear, so far as the offset is small, the crystal planes 143 immediately disappear. Further, even if the crystal planes 143 which appear do not disappear, unless the crystal planes 143 extend to an extent where the crystal planes 43 disappear, for example, an effect of maintaining the rate of change of the length L is exerted.

(Change of Shape of Y'Z' Cross-Section According to Comparative Example)

Figure 9A:
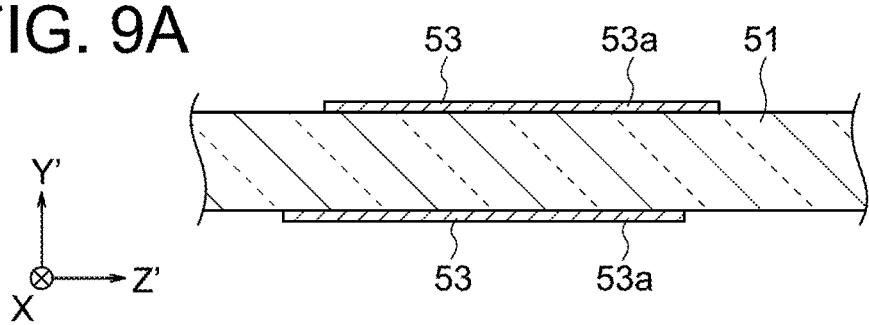
FIG. 9A, FIG. 9B, FIG. 9C, FIG. 9D, and FIG. 9E are views showing changes of cross-sectional shape of the crystal blank portion according to a comparative example and corresponding to the IIId-IIId line in FIG. 1.
Figure 9B:
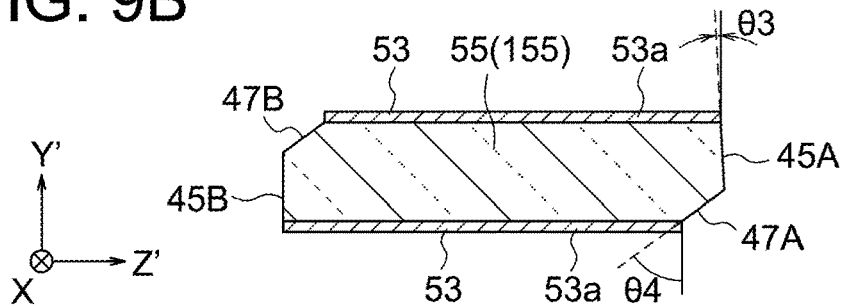

FIG. 9A to FIG. 9E are views showing changes of the cross-sectional shape of the crystal blank portion 155 according to the comparative example and correspond to the IIId-IIId line in FIG. 1. Further, FIG. 9A to FIG. 9E correspond to FIG. 6A to FIG. 6E concerning the timing of the etching process. Note that, FIG. 9A and FIG. 9B are drawings which are common between the present embodiment and comparative example. In these views, basically notations in the embodiment will be attached, while notations in the comparative example will be attached in parentheses according to need.

FIG. 9A shows a state where a pair of first masks 53 are formed on the pair of major surfaces of the wafer 51 (step ST2). Between the pair of first masks 53, the positions of the edge parts in the Z'X direction of the outer shape mask portions 53a are for example offset somewhat from each other.

FIG. 9B shows a state where the wafer 51 is etched through the first masks 53 to form the crystal blank portion 155 (55) (step ST3). At this time, crystal planes 45 and 47 explained with reference to FIG. 3D appear on the side surfaces corresponding to the long sides of the crystal blank portion 155 (55).

The crystal planes 45 and 47 are different from each other in inclination angle relative to the Y'-axis. However, by offsetting the positions of the outer shape mask portions 53a between the pair of first masks 53 from each other, the positions in the Y'-axis direction of the ridges at which the crystal planes 45 and 47 intersect are made suitable positions.

Figure 9C:
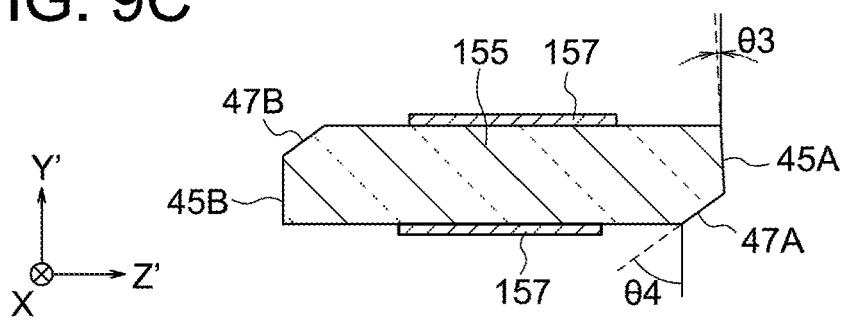

FIG. 9C shows a state where a pair of second masks 157 are formed on the pair of major surfaces of the wafer 51 (corresponding to step ST5). The second masks 157, as already explained, basically differ from the second masks 57 in the embodiment only on the point that the edge mask portions 57d are not provided.

Figure 9D:
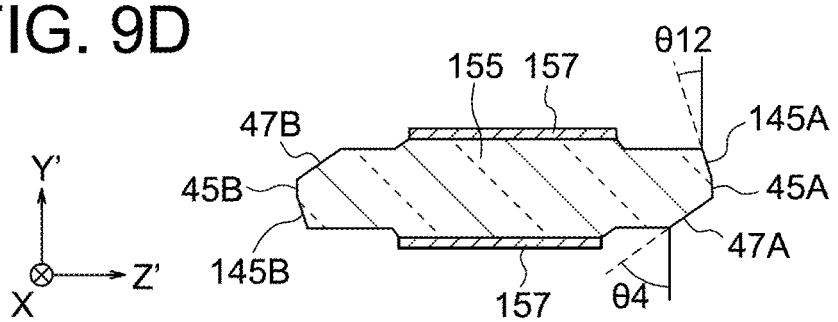

FIG. 9D shows a state where etching of the crystal blank portion 155 is started through the second masks 157 (corresponding to step ST6). The outer peripheral portion 133 of the crystal blank portion 155 is etched on its pair of major surfaces and on the two side surfaces in the Z'-axis direction. Accordingly, the outer peripheral portion 133 becomes thinner relative to the mesa portion 131, and the width of the crystal blank portion 155 (Z'-axis direction) becomes narrower.

At the side surfaces in the Z'-axis direction of the outer peripheral portion 133, on the sides of the crystal planes 47 (+Y'-axis direction at the side surface in the −Z'-axis direction, while −Y'-axis direction at the side surface in the +Z'-axis direction), the states of the crystal planes 47 and the major surfaces intersecting with each other are maintained. On the other hand, on the sides of the crystal planes 45

(−Y'-axis direction at the side surface in the −Z'-axis direction, while +Y'-axis direction at the side surface in the +Z'-axis direction), new crystal planes 145A and 145B (below, sometimes "A" and "B" will be omitted) appear.

The crystal planes 145 are positioned closer to the major surface side (−Y'-axis direction at the side surface in the −Z'-axis direction, while +Y'-axis direction at the side surface in the +Z'-axis direction) relative to the crystal planes 45. The inclination angle θ12 of the crystal planes 145 relative to the Y'-axis direction is for example about 18° (for example, 16° to 20°).

According to the etching conditions and the like, simultaneously with appearance of the crystal planes 145 or before or after that, crystal planes 147A and 147B positioned closer to the major surface side than the crystal planes 145 (FIG. 9E. below, sometimes "A" and "B" will be omitted.) appear. The inclination angle θ13 of the crystal planes 147 relative to the Y'-axis direction is for example about 37° (for example 35° to 39°).

Figure 9E:
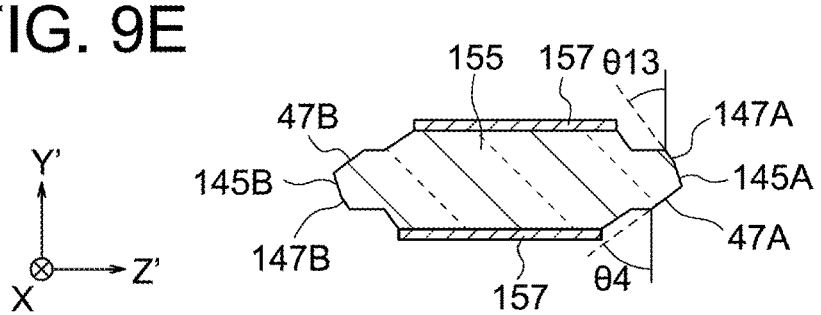

FIG. 9E shows a state where the etching of the crystal blank portion 155 through the second masks 157 (corresponding to step ST6) further advances. Relative to FIG. 9D, the outer peripheral portion 133 becomes further thinner, and the width of the crystal blank 155 becomes further shorter.

On the side surfaces in the Z'-axis direction of the outer peripheral portion 133, the crystal planes 47 are maintained, while the crystal planes 45 no longer appear, so the ridges of the side surfaces are configured by the crystal planes 47 and the crystal planes 145. Note that, if the time of mesa etching is made further longer, even between the crystal planes 47 and the crystal planes 145, sometimes new crystal planes (for example an inclination angle relative to the Y'-axis of about 10°) appear.

For the width (Z'-axis direction) of the crystal blank 15 (crystal blank portion 55, 155) as well, a similar problem arises as that in the X-axis direction. That is, if the crystal planes 45 disappear and the crystal planes configuring the ridges on the side surfaces are replaced by other crystal planes, the rate of change of the width relative to the etching time changes.

(Change of Shape of Y'Z' Cross-Section According to Embodiment)

Figure 10A:
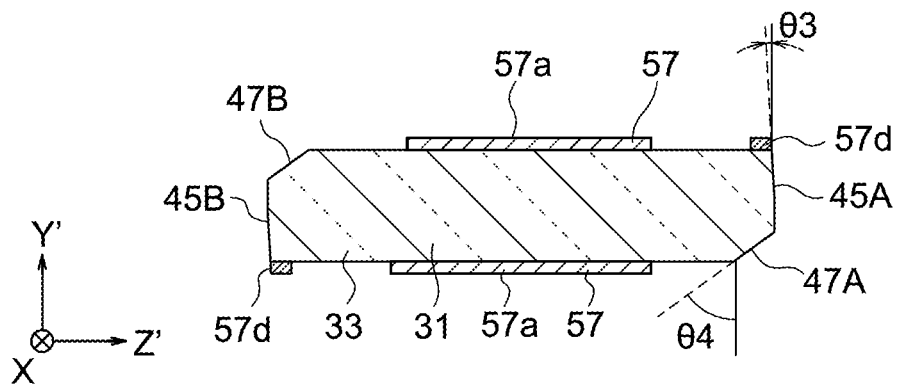
FIG. 10A, FIG. 10B, and FIG. 10C are views showing changes of cross-sectional shape of the crystal blank portion according to an embodiment and corresponding to the IIId-IIId line in FIG. 1.
Figure 10B:
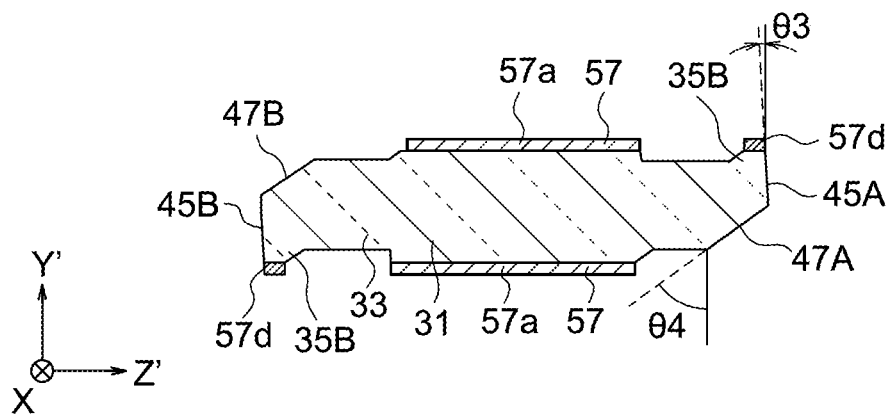
Figure 10C:
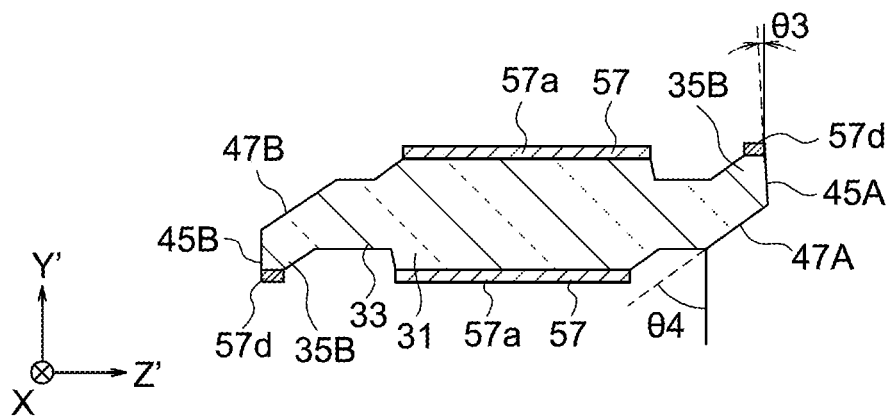

FIG. 10A to FIG. 10C are views showing changes of the cross-sectional shape of the crystal blank portion 55 according to the embodiment and correspond to FIG. 9C to FIG. 9E according to the comparative example. It is as already explained that FIG. 9A and FIG. 9B show also the changes of the cross-sectional shape in the embodiment.

FIG. 10A shows a state where the second masks 57 are formed (step ST5). The second masks 57 have edge mask portions 57d corresponding to the long-side projecting portions 35B. The edge mask portions 57d are for example positioned at the edge parts of the major surfaces of the crystal blank portion 55 which are in contact with the crystal planes 45. Between the pair of second masks 57, the positions of the edge parts in the Z'-axis direction of the mesa mask portions 57a are for example offset somewhat from each other.

FIG. 10B shows a state where etching of the crystal blank portion 55 is started through the second masks 57 (step ST6). Since the second masks 57 have the edge mask portions 57d, the etching in the portions at the side surfaces in the Z'-axis direction which are closer to the crystal plane 45 sides (−Y'-axis direction at the side surface in the −Z'-axis direction, while +Y'-axis direction at the side surface in the +Z'-axis direction) advances in the same way as the etching through the first masks 53 (step ST3). Accordingly, for example, the crystal planes 145 and 147 in the comparative example do not appear, and the state of the side surfaces in the Z'-axis direction being configured by the crystal planes 45 and 47 is maintained.

FIG. 10C shows a state where the etching of the crystal blank portion 55 through the second masks 57 (step ST6) further advances (for example a state where the etching is completed). Relative to FIG. 10B, the outer peripheral portion 33 becomes further thinner, but the crystal planes 45 do not disappear, but are maintained. By the crystal planes 45 being maintained in this way, the change of the rate of change of the width relative to the etching time is suppressed. The outer peripheral portion 33 is cut down deeper than the long-side projecting portions 35B, so long-side projecting portions 35B having heights relative to the outer peripheral portion 33 equivalent to the mesa portion 31 are formed.

Note that, it was explained that FIG. 9A and FIG. 9B are common between the comparative example and the embodiment. However, the etching speed at the side surfaces in the Z'-axis direction is different between the comparative example and the embodiment, therefore the dimensions of the outer shape mask portions 53a of the first masks 53 may be different from each other.

The positions in the Y'-axis direction of the ridges at which the crystal planes 45 and the crystal planes 47 intersect may be for example set by suitably offsetting the positions of the edge parts in the Z'-axis direction of the outer shape mask portions 53a between the pair of first masks 53. In FIG. 10C, although the ridges described before fall in the range of the thickness of the outer peripheral portion 33, they may also be left only at the long-side projecting portions 35B, and the side surfaces of the outer peripheral portion 33 may be formed only by the crystal planes 47. That is, the crystal planes which the long-side projecting portions 35B contact need not be the crystal planes 45, but may be the crystal planes 47 as well.

In the present disclosure, illustration of undercut is omitted (ideal etching is shown). Therefore, in FIG. 10A to FIG. 10C, the etching of the crystal planes 45 does not advance, so the width (Z'-axis direction) of the crystal blank portion 55 does not change. Note that, in actuality, the width may be made narrower by undercut.

In the same way as the XY' cross-section, the whole parts right below the edge mask portions 57d may be etched somewhat (the heights of the long-side projecting portions 35B may be made less than the height of the mesa portion 31) by undercut advancing, the crystal planes 145 or 147 may appear by undercut advancing, the broadnesses of the appeared crystal planes 145 or 147 may be controlled to suitable ones (the side surfaces of the long-side projecting portions 35B need not be flush with the crystal planes 45 and the long-side projecting portions 35B may contact not the crystal planes 45, but with the crystal planes 145 or 147), and, in the manufacturing method of the present disclosure, the long-side projecting portions 35B need not remain finally either and the like.

As described above, in the present embodiment, the oscillating element 5 has a crystal blank 15, a pair of excitation electrodes 17, and (at least) one pair of pad portions 19a. The crystal blank 15 has a pair of major surfaces and side surfaces which connect outer edges of the pair of major surfaces, at least a portion of which being configured by crystal planes. Further, the crystal blank 15 has a mesa portion 31 and an outer peripheral portion 33 which surrounds the mesa portion 31 when viewed on a plane and with a thickness between the pair of major surfaces thinner than that of the mesa portion 31. The pair of excitation electrodes 17 are individually positioned on the pair of major surfaces in the mesa portion 31. The pair of pad portions 19a are positioned on one of the pair of major surfaces in the outer peripheral portion 33 and are electrically connected with the pair of excitation electrodes 17. Further, the crystal blank 15, in at least a portion of the edge parts in the pair of major surfaces which are in contact with the crystal planes (for example 43, 45, or 47), has at least one projecting portion 35 which projects from the outer peripheral portion 33 with a height not more than the height of the mesa portion 31 from the outer peripheral portion 33.

Accordingly, for example, the crystal planes configuring the side surfaces of the crystal blank 15 are positioned not only at the outer peripheral portion 33, but also at the projecting portions 35. As a result, for example, the broadnesses of the crystal planes can be adjusted exceeding the broadnesses of the side surfaces of the outer peripheral portion 33. That is, the degree of freedom of design is improved. The broadnesses of the side surfaces (crystal planes) may exert an influence upon the crystal impedance and the like, therefore an increase of degree of freedom of adjustment of the vibration characteristic can be expected. Further, by provision of the projecting portions 35, for example, the drop in strength of the crystal blank 15 due to the outer peripheral portion 33 being made thinner can be reduced. As a result, for example, the possibility of unintended stress being generated in the crystal blank 15 due to the dead weight of the crystal blank 15 and/or shrinkage stress of the bumps 21 or the like so the vibration characteristic of the crystal blank 15 deviating from the desired one can be reduced. On the other hand, the projecting portions 35 are positioned at the edge parts of the major surfaces of the crystal blank 15 and are separated from the mesa portion 31 to the maximum limit, therefore the probability of the projecting portions 35 exerting an unintended influence upon the vibration characteristic of the mesa portion 31 is reduced.

Further, in the present embodiment, the crystal blank 15 is an AT-cut plate. The "at least one projecting portion 35" described before includes a short-side projecting portion 35A which is provided along the short side positioned in the +X-axis direction on the major surface in the pair of major surfaces which faces the +Y'-axis direction and a short-side projecting portion 35A which is provided along the short side positioned in the +X-axis direction on the major surface in the pair of major surfaces which faces the −Y'-axis direction.

Accordingly, for example, by the short-side projecting portions 35A being projected rims, the effect of improvement of the degree of freedom of design explained above or improvement of strength increases. Further, usually the extraction electrodes 19 are provided adjacent to the short sides. Accordingly, for example, by providing the pad portions 19a not only on the major surfaces of the outer peripheral portion 33, but also on the surfaces of the short-side projecting portions 35A, the joined areas of the pad portions 19a and the bumps 21 are made larger, so the reliability of mounting can be improved. Further, for example, even if the shrinkage stress of the pair of bumps 21 act so as to bend the short sides of the crystal blank 15, the transfer of the stress to the mesa portion 31 is mitigated by the reinforcing effect of the short-side projecting portions 35A.

Further, in the present embodiment, the crystal blank 15 is an AT-cut plate. The "at least one projecting portion 35" described before includes a long-side projecting portion 35B which is provided along the long side positioned in the +Z'-axis direction on the major surface in the pair of major surfaces which faces the +Y'-axis direction and a long-side projecting portion 35B which is provided along the long side positioned in the −Z'-axis direction on the major surface in the pair of major surfaces which faces the −Y'-axis direction.

Accordingly, for example, by the long-side projecting portions 35B being projected rims, the effect of improvement of the degree of freedom of design explained above or improvement of strength increases. Further, there are many modes where the crystal blank 15 is supported in a cantilever manner in the long direction. In such modes, the bending moment in the long direction becomes large. However, due to the reinforcing effect of the long-side projecting portions 35B, the transfer of such a bending moment to the mesa portion 31 is mitigated.

Further, in the present embodiment, the method of manufacturing the oscillating element 5 has a first mask forming step (ST2), outer shape etching step (ST3), second mask forming step (ST5), mesa etching step (ST6), and conductive film forming step (ST8). In the first mask forming step, the pair of first masks 53 are formed on the pair of major surfaces of the crystal wafer 51. In the outer shape etching step, wet etching is carried out on the crystal wafer 51 through the pair of first masks 53 to thereby form the crystal blank portion 55 having the pair of major surfaces and the side surfaces which include the crystal planes appearing due to the etching (for example 41, 43, 45, or 47) and connect the outer edges of the pair of major surfaces to each other. In the second mask forming step, the pair of second masks 57 are formed on the pair of major surfaces of the crystal blank portion 55 from which the pair of first masks 53 are removed. In the mesa etching step, wet etching of the crystal blank portion 55 is carried out through the pair of second masks 57 to thereby form the mesa portion 31 and the outer peripheral portion 33 which surrounds the mesa portion 31 when viewed on a plane and in which the thickness between the pair of major surfaces is thinner than that of the mesa portion 31. The conductive film forming step forms the pair of excitation electrodes 17 individually positioned on the pair of major surfaces of the crystal blank portion 55 in the mesa portion 31 and forms the pair of pad portions 19a positioned on one of the pair of major surfaces of the crystal blank portion 55 in the outer peripheral portion 33 and electrically connected with the pair of excitation electrodes 17. At least one of the pair of second masks 57 has a mesa mask portion 57a covering the region in the major surface of the crystal blank portion 55 which becomes the mesa portion 31 and has at least edge mask portions 57d covering at least portions of the edge parts at the major surfaces of the crystal blank portion 55 which contact the crystal planes (41 43, 45, or 47).

Accordingly, for example, the projecting portions 35 in contact with the crystal planes explained above can be realized and consequently the oscillating element 5 capable of exerting the effects explained above can be realized. Further, for example, if the influence of under-etching is ignored, the etching of the crystal planes which the edge mask portions 57d contact does not advance. Therefore, by making the length or width shorter relative to the amount cut down, the area which becomes discarded in the wafer 51 can be reduced.

Further, in the present embodiment, the crystal planes which the edge parts provided at the edge mask portions 57d contact are the crystal planes (for example 43 or 45) on which the other crystal planes (for example 143 or 145)

appear between them and the major surfaces of the outer peripheral portion 33 when performing the mesa etching step (step ST6) without providing the edge mask portions 57d in the second masks 57.

Accordingly, for example, as explained with reference to FIG. 6A to FIG. 10C, the probability of the crystal planes (for example 43 or 45) which define the length of the crystal blank portion 55 before the mesa etching end up disappearing is reduced. As a result, the adjustment of the length of the crystal blank 15 by the etching time is facilitated. Further, the influence of the shapes of the side surfaces of the crystal blank 15 exerted upon the vibration characteristic is intricately related with coupling of the thickness-shearing vibration and various unnecessary vibration modes. Therefore, where new crystal planes (for example 143 or 145) appear, the characteristic does not always improve. Accordingly, for example, by increase of the choice of suppression of appearance of new crystal planes by the edge mask portions 57d and/or maintaining of the crystal planes before the mesa etching (by improvement of the degree of freedom of design), further improvement of the vibration characteristic can be expected.

Note that, in the above embodiment, the crystal unit 1 is one example of the crystal oscillation device, and the pad portions 19a are one example of the pads.

The present invention is not limited to the above embodiment and may be executed in various ways.

The crystal oscillation device having the crystal oscillating element is not limited to a crystal unit. For example, it may be an oscillator which has, in addition to the crystal oscillating element, an integrated circuit (IC) element generating an oscillation signal by applying voltage to the crystal oscillating element. Further, for example, the crystal oscillation device (crystal unit) may be one having a thermistor or other electronic element in addition to the crystal oscillating element. Further, the crystal oscillation device may be one equipped with a crystal oven as well. In the crystal oscillation device, the structure of the package for packaging the crystal oscillating element may be a suitable one. For example, the package may be one having an H-shaped cross-section that has recessed portions in the upper surface and lower surface as well.

The crystal oscillating element is not limited to one utilizing thickness shearing vibration, and the crystal blank is not limited to an AT-cut plate. The crystal oscillating element or crystal blank which can be formed to a mesa type is sufficient. For example, the crystal blank may be a BT-cut plate as well. Further, the crystal oscillating element is not limited to one supported in a cantilever manner (one providing a pair of pads on one end side) and may be one supported at the two ends as well.

In the embodiment, in a configuration where new second crystal planes appear between the major surfaces and the first crystal planes due to the mesa etching, the projecting portions were provided adjacent to the first crystal planes. However, the projecting portions need not be adjacent to the first crystal planes. Conversely, even if the mesa etching is carried out, in a configuration where new crystal planes do not appear between the major surfaces and third crystal planes, projecting portions may be provided adjacent to the third crystal planes as well.

Also, the positions of arrangement of the projecting portions (planar shapes when viewing the major surfaces on a plane) may be suitably set. For example, the projecting portions may extend over the entire circumference on at least one of the pair of major surfaces of the crystal blank as well. In this case, for example, the effects of spreading the crystal planes and reinforcing the edge parts increase. Further, the projecting portions need not extend over the entire lengths of the short sides or long sides of the major surfaces of the crystal and may extend only in portions as well. For example, by providing the projecting portions only in most parts on the center sides of the short sides and/or long sides (for example 90% or less of the entire lengths), the formation of new crystal planes may be suppressed in the most part and chamfering may be carried out by the formation of new crystal planes in the corner portions.

The projecting portions may be provided only on one of the pair of major surfaces of the crystal as well. From another viewpoint, the edge mask portions may be provided only in one of the pair of second masks as well. When a plurality of projecting portions are provided, the heights of the plurality of projecting portions may be the same as each other, or may be different from each other.

REFERENCE SIGNS LIST

1 . . . crystal unit (crystal oscillation device), 5 . . . crystal oscillating element, 15 . . . crystal blank, 31 . . . mesa portion, 33 . . . outer peripheral portion, 17 . . . excitation electrode, 19 . . . extraction electrode, 19a . . . pad portion, and 43 . . . crystal plane.

The invention claimed is:

1. A mesa type crystal oscillating element comprising
a crystal blank
comprising
a pair of major surfaces and
side surfaces which connect outer edges of the pair of major surfaces to each other and comprise at least a portion which is comprised of a crystal plane and
comprising
a mesa portion and
an outer peripheral portion which surrounds the mesa portion when viewing the pair of major surfaces on a plane and is thinner in a thickness between the pair of major surfaces than the mesa portion,
a pair of excitation electrodes individually located on the pair of major surfaces in the mesa portion, and
a pair of pads located on one of the pair of major surfaces in the outer peripheral portion and electrically connected with the pair of excitation electrodes by wirings narrower than the pads, the pair of pads being located at a one side other than the mesa portion in a longitudinal direction of the crystal blank, wherein
the crystal blank comprises at least one projecting portion which projects from the outer peripheral portion with a height not more than a height of the mesa portion from the outer peripheral portion in at least a portion of an edge part in the pair of major surfaces, the edge part being in contact with the crystal plane,
said at least one projecting portion includes a first projecting portion located at the one side other than the mesa portion, and
the pair of pads comprises a region located at another side other than the first projecting portion in the longitudinal direction.

2. The mesa type crystal oscillating element according to claim 1, wherein:
the crystal blank is an AT-cut plate, and
said at least one projecting portion includes a projecting portion which is along a short side located in the +X-axis direction at the major surface in the pair of major surfaces which faces the +Y'-axis direction, and a projecting portion which is along a short side located in the +X-axis direction at the major surface in the pair of major surfaces which faces the −Y'-axis direction.

3. The mesa type crystal oscillating element according to claim 1, wherein:

the crystal blank is an AT-cut plate, and said at least one projecting portion includes a projecting portion which is along a long side located in the +Z'-axis direction in the major surface in the pair of major surfaces which faces the +Y'-axis direction, and a projecting portion which is along a long side located in the −Z'-axis direction in the major surface in the pair of major surfaces which faces the −Y'-axis direction.

4. A mesa type crystal oscillation device comprising a crystal oscillating element according to claim 1 and a package in which the crystal oscillating element is mounted.

5. A method for manufacturing a mesa type crystal oscillating element comprising a first mask forming step forming a pair of first masks on a pair of major surfaces of a crystal wafer, an outer shape etching step performing wet etching on the crystal wafer through the pair of first masks to thereby form a crystal blank portion comprising a pair of major surfaces and side surfaces which include a crystal plane appearing due to the etching and connect outer edges of the pair of major surfaces to each other, a second mask forming step forming a pair of second masks on the pair of major surfaces of the crystal blank portion from which the pair of first masks have been removed, a mesa etching step performing wet etching of the crystal blank portion through the pair of second masks to thereby form a mesa portion and an outer peripheral portion which surrounds the mesa portion when viewing the pair of major surfaces of the crystal blank portion on a plane and is thinner in a thickness between the pair of major surfaces than the mesa portion, and a conductive film forming step forming a pair of excitation electrodes which are respectively located on the pair of major surfaces of the crystal blank portion in the mesa portion and a pair of pads which are located on one of the pair of major surfaces of the crystal blank portion in the outer peripheral portion and are electrically connected with the pair of excitation electrodes by wirings narrower than the pads, the pair of pads being located at a one side other than the mesa portion in a longitudinal direction of the crystal blank portion, wherein at least one of the pair of second masks comprises a mesa mask portion covering a region in the major surfaces of the crystal blank portion which becomes the mesa portion and an edge mask portion covering at least a portion of an edge part in the major surface of the crystal blank portion, the edge part being in contact with the crystal plane and being located at the one side other than the mesa portion, and the pair of pads comprises a region located at another side other than the first projecting portion in the longitudinal direction.

6. The method for manufacturing the mesa type crystal oscillating element according to claim 5, wherein the crystal plane is crystal plane where other crystal plane appears between the former crystal plane and the major surface of the outer peripheral portion when performing the mesa etching step without providing the edge mask portion in the second masks.

7. A mesa type crystal oscillating element comprising a crystal blank comprising a pair of major surfaces and side surfaces which connect outer edges of the pair of major surfaces to each other and comprise at least a portion which is comprised of a crystal plane and comprising a mesa portion and an outer peripheral portion which surrounds the mesa portion when viewing the pair of major surfaces on a plane and is thinner in a thickness between the pair of major surfaces than the mesa portion, a pair of excitation electrodes individually located on the pair of major surfaces in the mesa portion, and a pair of pads located on one of the pair of major surfaces in the outer peripheral portion and electrically connected with the pair of excitation electrodes by wirings narrower than the pads, wherein the crystal blank comprises at least one projecting portion which projects from the outer peripheral portion with a height not more than a height of the mesa portion from the outer peripheral portion in at least a portion of an edge part in the pair of major surfaces, the edge part being in contact with the crystal plane, said at least one projecting portion includes a projecting portion being along a long side of the major surface.

* * * * *